US008225180B2

(12) United States Patent
Jiang et al.

(10) Patent No.: US 8,225,180 B2
(45) Date of Patent: *Jul. 17, 2012

(54) ERROR CORRECTING CODES FOR RANK MODULATION

(75) Inventors: Anxiao Jiang, College Station, TX (US); Moshe Schwartz, Rehovot (IL); Jehoshua Bruck, La Canada, CA (US)

(73) Assignees: California Institute of Technology, Pasadena, CA (US); Texas A&M University System, College Station, TX (US)

( * ) Notice: Subject to any disclaimer, the term of this patent is extended or adjusted under 35 U.S.C. 154(b) by 878 days.

This patent is subject to a terminal disclaimer.

(21) Appl. No.: 12/275,190

(22) Filed: Nov. 20, 2008

(65) Prior Publication Data

US 2009/0132895 A1 May 21, 2009

Related U.S. Application Data

(60) Provisional application No. 61/010,827, filed on Jan. 11, 2008, provisional application No. 61/003,865, filed on Nov. 20, 2007.

(51) Int. Cl.
*G11C 29/00* (2006.01)
(52) U.S. Cl. ................... 714/773; 714/781; 365/185.03
(58) Field of Classification Search ................. 714/781, 714/773; 365/185.03
See application file for complete search history.

(56) References Cited

U.S. PATENT DOCUMENTS

| 3,196,351 | A | | 7/1965 | Slepian |
| 6,266,279 | B1 | | 7/2001 | Yoshimura |
| 7,656,706 | B2 | * | 2/2010 | Jiang et al. ............... 365/185.03 |
| 7,904,783 | B2 | * | 3/2011 | Brandman et al. ............ 714/755 |
| 8,055,979 | B2 | * | 11/2011 | Wu et al. ........................ 714/773 |
| 2002/0118573 | A1 | | 8/2002 | Pasotti |
| 2005/0237798 | A1 | | 10/2005 | Urabe et al. |
| 2008/0168320 | A1 | * | 7/2008 | Cassuto et al. ................ 714/746 |
| 2011/0296274 | A1 | * | 12/2011 | Mittelholzer et al. ........ 714/755 |

OTHER PUBLICATIONS

2008 IEEE International Symposium on Information Theory (ISIT2008), Toronto, Ontario, Canada, poster, retrieved off the internet at URL http://www.isit2008.org/ on Oct. 20, 2009.

ALEPH One, "YAFFS: Yet another flash filing system . . . ", Cambridge, UK, 2002, retrieved from the Internet at http://web.archive.org/web/20040217235559/http:/www.aleph1.co.uk/yaffs/index.html as posted on Feb. 17, 2004. The YAFFS material has been moved to www.yaffs.net.

(Continued)

*Primary Examiner* — Philip Guyton
(74) *Attorney, Agent, or Firm* — Kilpatrick Townsend & Stockton LLP

(57) ABSTRACT

We investigate error-correcting codes for a novel storage technology, which we call the rank-modulation scheme. In this scheme, a set of n cells stores information in the permutation induced by the different levels of the individual cells. The resulting scheme eliminates the need for discrete cell levels, and overshoot errors when programming cells (a serious problem that reduces the writing speed), as well as mitigates the problem of asymmetric errors. In this discussion, the properties of error correction in rank modulation codes are studied. We show that the adjacency graph of permutations is a subgraph of a multi-dimensional array of a special size, a property that enables code designs based on Lee-metric codes and $L_1$-metric codes. We present a one-error-correcting code whose size is at least half of the optimal size. We also present additional error-correcting codes and some related bounds.

42 Claims, 12 Drawing Sheets

OTHER PUBLICATIONS

Aritome, S. et al., "Reliability issues of flash memory cells", Proceedings of the IEEE, 81(5):776-788 May 1993.

Baer, M. B., "Optimal prefix codes for infinite alphabets with nonlinear costs", IEEE Trans. on Inform. Theory, 54(3):1273-1286, Mar. 2008.

Berger, T. et al., "Permutation codes for sources", IEEE Trans. on Inform. Theory, IT-18(1):160-169, Jan. 1972.

Birrell, A. et al., "A design for high performance flash disks," ACM Operating Systems Review, 41(2):88-93, Apr. 2007.

Blaum, M. et al., "Interleaving schemes for multidimensional cluster errors", IEEE Transactions on Information Theory, 44(2):730-743, Mar. 1998.

Bohossian, V. et al., "Buffer coding for asymmetric multi-level memory", IEEE International Symposium on Information Theory (ISIT2007), Nice, France, pp. 1186-1190, Jun. 2007.

Cappelletti, P. et al., Chapter 5, "Memory Architecture and Related Issues" in Flash memories, Kluwer Academic Publishers, pp. 241-360,1st Edition (1999).

Cappelletti, P. et al., Chapter 6, "Multilevel Flash Memories", in Flash Memories, Kluwer Academic Publishers, pp. 361-397, 1st Edition (1999).

Cohen, G. D. et al., "Linear binary code for write-once memories", IEEE Trans. on Inform. Theory, IT-32(5):697-700, Sep. 1986.

Dan, R. et al., "A TrueFFS® and FLite™ technical overview of M-systems' flash file systems", Technical Report 80-SR-002-00-6L Rev. 1.30, Mar. 1997, 14 pages.

Dietz, P., "Optimal algorithms for list indexing and subset rank", from Lecture Notes in Computer Science, G. Goos, ed., at 39-46, Springer-Verlag London, UK (1989).

Douglis, F. et al., Proceedings of the First USENIX Symposium on Operating Systems Design and Implementation (OSDI), pp. 25-37, Monterey, CA, Nov. 14-17, 1994.

Fiat, A. et al., "Generalized 'write-once' memories", IEEE Trans. on Inform. Theory, IT-30(3):470-480, May 1984.

Fu, F. et al., "On the capacity of generalized write-once memory with state transitions described by an arbitrary directed acyclic graph," 45(1):308-313, Jan. 1999.

Gal, E. et al., "Algorithms and data structures for flash memories", ACM Computing Surveys, 37(2):138-163, Jun. 2005.

Golin, M. J. et al., "A dynamic programming algorithm for constructing optimal prefix-free codes with unequal letter costs", IEEE Trans. on Inform. Theory, 44(5):1770-1781, Sep. 1998.

Golomb, S. W. et al., "Perfect codes in the Lee metric and the packing of polyominoes", SIAM J. Appl. Math., 18(2):302-317, Jan. 1970.

Hall, M. Jr. et al., "Combinatorial analysis and computers", Amer. Math. Monthly, 72(2):21-28, (1965).

Heegard, C. et al., "On the capacity of computer memory with defects", IEEE Trans. on Inform. Theory, IT-29(5):731-739, (Sep. 1983).

Heegard, C., "On the capacity of permanent memory", IEEE Trans. on Inform. Theory, IT-31(1):34-42, Jan. 1985.

Huffman, D. A. "A method for the construction of minimum-redundancy codes", Proceedings of the Institute of Radio Engineers, 40(9):1098-1101, Sep. 1952.

Hwang, F. K., "Generalized Huffman trees", SIAM J. Appl. Math., 37(1):124-127, Aug. 1979.

Jiang, A. et al., "Floating codes for joint information storage in write asymmetric memories", Proceedings of the 2007 IEEE International Symposium on Information Theory (ISIT2007), Nice, France, pp. 1166-1170, Jun. 2007.

Jiang, A. et al., "Joint coding for flash memory storage", Proceedings of the 2008 IEEE International Symposium on Information Theory (ISIT2008), Toronto, Canada, pp. 1741-1745, Jul. 6-11, 2008.

Knuth, D. E., "The art of computer programming", vol. 3: Sorting and Searching, Addison Wesley, Reading, MA, 2nd ed., (1998), Section 5.2.4 at pp. 158-168, Section 6.2.2 at pp. 426-448.

Kuznetsov, A. et al., "On the general defective channel with informed encoder and capacities of some constrained memories", IEEE Trans. on Inform. Theory, 40(6):1866-1871, Nov. 1994.

Lehmer, D. H., "Teaching combinatorial tricks to a computer", Proc. Sympos. Appl. Math. Combinatorial Analysis, 10:179-193 (1960).

Mares, M. et al., "Linear-time ranking of permutations", Algorithms-ESA, pp. 187-193 (2007).

Myrvold, W. et al., "Ranking and unranking permutations in linear time", Information Processing Letters, 79(6):1-6, Apr. 13, 2000.

Pavan, P. et al., "Flash memory cells—an overview", Proceedings of the IEEE, 85(8):1248-1271, Aug. 1997.

Rivest, R. L. et al., "How to reuse a 'write-once' memory", Information and Control, 55:1-19 (1982).

Sedgewick, R., "Permutation generation methods", Computing Surveys, 9(2):137-164, Jun. 1977.

Slepian, D., "Permutation modulation", Proc. of the IEEE, 53(3):228-236 (1965).

"SanDisk launches 64 gigabyte solid state drives for notebook PCs, meeting needs for higher capacity," Press Release, Business Wire, Jun. 5, 2007, 5 pages.

Web article entitled "PQI unveils 256GB solid state drive," retrieved from the Internet at URL http://web.archive.org/web/20070603192642/www.guru3d.com/news.html as posted on Jun. 4, 2007.

Wolf, J. K. et al., "Coding for a write-once memory", AT&T Bell Laboratories Technical Journal 63(6):1089-1112, Jul.-Aug. 1984.

Woodhouse, D., "JFFS: The journaling flash file system," Ottawa Linux Symposium, 2001, 12 pages.

International Search Report dated May 7, 2009 for PCT Application No. PCT/US2008/084235.

Jiang, "On the generalization of error-correcting WOM codes," Information Theory, 2007, ISIT 2007, IEEE International Symposium on, IEEE, Piscataway, NJ, USA, Jun. 24-29, 2007, pp. 1391-1395.

Orlov, "Error correcting sparse permutation channel codes for digital holographic data storage," Proc. of SPIE—The International Society for Optical Engineering, vol. 6620, May 20, 2007, pp. 662026-1-662026-8, Portland, OR, USA.

Savage, "A survey of combinatorial gray codes," SIAM Review, vol. 39, No. 4, pp. 605-629, Dec. 1997.

* cited by examiner

| Order of cell levels | Ternary variable |
|---|---|
| (1,2,3) → | 1 |
| (1,3,2) → | 1 |
| (2,1,3) → | 2 |
| (2,3,1) → | 2 |
| (3,1,2) → | 3 |
| (3,2,1) → | 3 |

| Permutation | Coordinates |
|---|---|
| 1 2 3 | → (0,0) |
| 1 3 2 | → (0,1) |
| 2 1 3 | → (1,0) |
| 2 3 1 | → (1,1) |
| 3 1 2 | → (0,2) |
| 3 2 1 | → (1,2) |

| Permutation | Coordinates | Permutation | Coordinates |
|---|---|---|---|
| (1,2,3,4) → | (0,0,0) | (3,1,2,4) → | (0,2,0) |
| (1,2,4,3) → | (0,0,1) | (3,1,4,2) → | (0,2,1) |
| (1,3,2,4) → | (0,1,0) | (3,2,1,4) → | (1,2,0) |
| (1,3,4,2) → | (0,1,1) | (3,2,4,1) → | (1,2,1) |
| (1,4,2,3) → | (0,0,2) | (3,4,1,2) → | (0,2,2) |
| (1,4,3,2) → | (0,1,2) | (3,4,2,1) → | (1,2,2) |
| (2,1,3,4) → | (1,0,0) | (4,1,2,3) → | (0,0,3) |
| (2,1,4,3) → | (1,0,1) | (4,1,3,2) → | (0,1,3) |
| (2,3,1,4) → | (1,1,0) | (4,2,1,3) → | (1,0,3) |
| (2,3,4,1) → | (1,1,1) | (4,2,3,1) → | (1,1,3) |
| (2,4,1,3) → | (1,0,2) | (4,3,1,2) → | (0,2,3) |
| (2,4,3,1) → | (1,1,2) | (4,3,2,1) → | (1,2,3) |

US 8,225,180 B2

ERROR CORRECTING CODES FOR RANK MODULATION

CROSS-REFERENCES TO RELATED APPLICATIONS

This application claims the benefit of U.S. Provisional Application Ser. No. 61/010,827 entitled "Error-Correcting Codes for Rank Modulation" by Anxiao Jiang, Jehoshua Bruck, and Moshe Schwartz filed Jan. 11, 2008 and claims the benefit of U.S. Provisional Application Ser. No. 61/003,865 entitled "BRAM: Balanced RAnk Modulation for Data Storage in Flash Memories" by Anxiao Jiang and Jehoshua Bruck filed Nov. 20, 2007. Priority of the filing dates is hereby claimed, and the disclosures of the prior applications are hereby incorporated by reference. This application is related to U.S. Application entitled "Rank Modulation for Memory Devices" by Anxiao Jiang et al. filed Nov. 20, 2008. The disclosure of this application is incorporated by reference.

BACKGROUND

The present invention relates to data storage devices and, more particularly, to error correction in data storage devices such as flash memory devices.

Flash memories are by far the most important type of electronic non-volatile memories (NVMs), accounting for nearly 90% of the NVM market. See, for example, the Web site of Saifun Semiconductors Ltd. (available at www.saifun.com) and Web-Feet Research, Inc. (available at www.web-feetresearch.com). Today, billions of flash memories are used in mobile, embedded, and mass-storage systems, mainly because of their high performance and physical durability. See, for example, P. Cappelletti et al., Chapter 5, "Memory Architecture and Related Issues" in *Flash memories*, Kluwer Academic Publishers, 1st Edition, 1999; and E. Gal and S. Toledo, *ACM Computing Surveys*, 37(2): 138-163 (2005). Well-known applications of flash memories include cell phones, digital cameras, USB flash drives, computers, sensors, and many more. They are now also replacing magnetic disks as hard disks, such as the 64 GB hard disk by SanDisk (see "SanDisk launches 64 gigabyte solid state drives for notebook PCs, meeting needs for higher capacity," available at the Web site URL of http://biz.yahoo.com/cnw/070604/sandisk.html?.v=1). See also the Web article on the 256 GB hard disk by PQI ("PQI unveils 256 GB solid state drive," available at the URL of www.guru3d.com/newsitem.php?id=5392). Based on the popular floating-gate technology, the dominance of flash memories is likely to continue.

However, there exist critical problems limiting the improvement of flash memories with respect to their speed, reliability, longevity, and storage capacity. Flash memories have a limited lifetime due to the quality degradation caused by block erasures; a flash memory can endure only about $10^5$~$10^6$ block erasures before it becomes no longer usable (see S. Aritome et al., *Proceedings of the IEEE*, 81(5):776-788 (1993), and P. Cappelletti et al., ibid. Removing charge from any single cell for data modification requires the block to be erased and all the 105 or so cells in it to be reprogrammed (or programmed to another block). The writing speed is constrained by a conservative cell-programming process that is about ten times slower than reading. The purpose of such conservative programming is to avoid over-programming, a serious error correctable only by block erasure and reprogramming. Data reliability is limited by errors caused by charge leakage, disturbs, and the like. See S. Aritome et al., ibid; P. Cappelletti et al., ibid; and P. Pavan et al., *Proceedings of The IEEE*, 85(8):1248-1271 (August 1997). The errors become more common when multi-level cells are used to increase the storage capacity.

New data storage modulation techniques that make more efficient use of the data storage cells in memory devices would be useful. Such new techniques should reduce the ill effects of over-programming of cells and increase the speed of data access.

New data storage modulation techniques will generate different types of error modalities as compared with conventional data storage modulation schemes. Systems that implement new data storage techniques will require error correction techniques tailored for the new modulation techniques.

From the discussion above, it should be apparent that there is a need for new error correction techniques that can recover from transmission errors resulting from new data modulation techniques and from errors in charge levels. The present invention satisfies these needs.

SUMMARY

In view of the above circumstances, a new scheme, the rank modulation scheme, for storing data in flash memories is provided. It aims at eliminating the risk of cell over-programming, and reducing the effect of asymmetric errors. Given a set of n cells with distinct charge levels, the rank of a cell indicates the relative position of its own charge level, and the ranks of the n cells induces a permutation of $\{1, 2, \ldots, n\}$. The rank modulation scheme uses this permutation to store information. To write data into the n cells, we first program the cell with the lowest rank, then the cell with the second lowest rank, and finally the cell with the highest rank. While programming the cell with rank i ($1 < i \leq n$), the only requirement is to make its charge level be above that of the cell with rank i−1.

Devices that operate in accordance with the rank modulation scheme decode a codeword received over an information channel from a source, wherein the codeword indicates n cell values that comprise a virtual cell in which relative rank ordering of the n cell values determines a permutation comprising one of n! permutations. Such devices determine if the received codeword comprises a valid codeword of a rank modulation code wherein if the received codeword is determined to be a valid codeword, then a corresponding value for the codeword is computed, and if the received codeword is determined not to be a valid codeword, then a corrected codeword is determined that differs from the received codeword by a value r, where r is the number of errors in a codeword that the rank modulation code can correct, and a corresponding value for the corrected codeword is computed.

Devices that operate in accordance with the rank modulation scheme encode a data value to be encoded into a codeword, wherein the codeword indicates n cell values that comprise a virtual cell in which relative rank ordering of the n cell values determines a permutation comprising one of n! permutations. Such devices encode by generating a permutation A corresponding to the codeword, wherein A is given by $A=[a_1, a_2, \ldots, a_n]$ integer values such that the $[a_1, a_2, \ldots, a_n]$ permutation conforms to a rank modulation scheme for data representation, and providing the permutation to a data destination over an information channel. Such encoding can be performed by determining coordinates that correspond to a codeword, wherein the coordinates specify a value that can correct erroneously read coordinates that differs from the correct coordinates by a distance r. Thus, encoding can be accomplished with a modulation code capable of correcting r errors in a received codeword.

The rank modulation scheme eliminates the need to use the actual values of cell levels to store information. Instead, the relative ranks of cell levels are used. Since there is no risk of over-programming and the cell charge levels can take continuous values, a substantially less conservative cell programming method can be used and the writing speed can be improved. In addition, asymmetric errors become less serious, because when cell levels drift in the same direction, their ranks are not affected as much as their absolute values. This way both the writing speed and the data reliability can be improved. The cell levels can be represented by, for example, charge levels in memory cells and signal features of a transmitted signal, wherein the signal features can comprise signal frequency, magnitude, or time duration. The cell values are modulated in accordance with the rank modulation scheme so that a group of cell values comprise a virtual cell in which relative rank ordering defines a permutation.

An error-correcting code for the rank modulation scheme can be produced by generating n! permutations, wherein the data storage device is configured to operate such that n cells of the storage device comprise a virtual cell in which relative rank ordering of the n cells determines a permutation of the n! permutations, selecting one of the n! permutations as a starting permutation, and retaining only the generated permutations having a distance greater than or equal to (2r+1), wherein the retained generated permutations comprise a rank modulation codeword alphabet that define a modulation code capable of correcting r errors in a transmitted codeword.

Other features and advantages of the present invention should be apparent from the following description of exemplary embodiments, which illustrate, by way of example, aspects of the invention.

DETAILED DESCRIPTION

The contents of this Detailed Description are organized under the following headings:
   I. Introduction to Rank Modulation
   II. Definitions and Notation
   III. Properties and Bounds
   IV. Error Correction
   V. Designing Error Correcting Rank Modulation Codes
   VI. More Codes and Embodiments I. Introduction to Rank Modulation A novel data storage modulation scheme called the rank-modulation scheme is described further in a co-pending U.S. patent application by Anxiao Jiang, et al. (see "Rank Modulation for Memory Devices" by A. Jiang et al. filed Nov. 20, 2008). The contents of that application are incorporated herein by reference.

The rank modulation scheme organizes a set of memory cells into a "virtual cell" such that each virtual cell stores information in a permutation determined by the different charge levels of the individual cells in the set. That is, the relative rank of the charge levels in the cells of a single set determines a permutation ordering that represents a codeword. The resulting data storage scheme eliminates the need for determining discrete cell charge levels to determine codewords. Therefore, overshoot errors when programming cells (a serious problem that reduces the writing speed of conventional flash memories) are eliminated, and problems with asymmetric errors are mitigated.

In the rank modulation scheme, a set of n cells is grouped into a single virtual cell such that each of the n cells has a distinct charge level, and the relative charge level of a cell indicates its rank in the group. The set of n cells determines a permutation $\{1, 2, 3, \ldots, n\}$ that corresponds to a codeword. Thus, the permutation is used to store information. In a set of cells, the cell with the highest level has the highest (first) rank and is first in the permutation, the second-highest cell has the next rank, and so forth to define a permutation in order from highest level cell to lowest level cell, such as $\{3, 2, 1, 4\}$ in the case of four cells. Thus, each permutation can correspond to a different codeword and thereby represent data.

Figure 1:
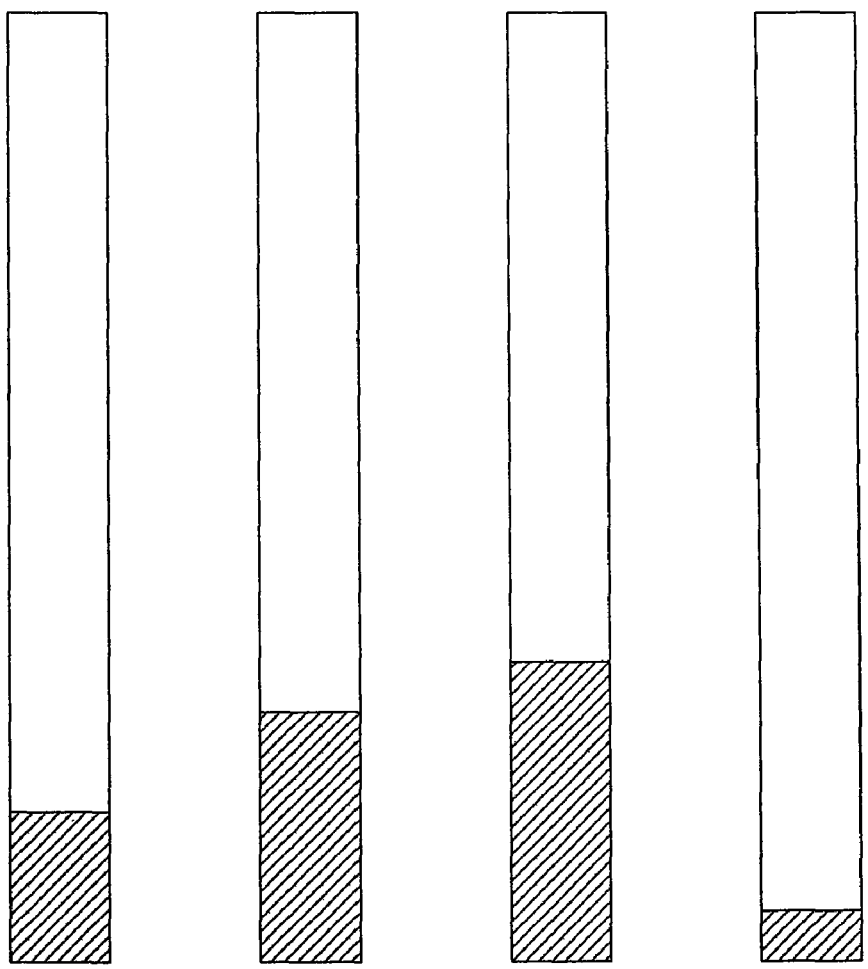
FIG. 1 is a schematic representation of a memory cell arrangement in accordance with the description herein.

FIG. 1 is a schematic representation of a memory cell arrangement in accordance with the rank modulation scheme wherein each rectangular box of FIG. 1 represents a conventional multilevel memory cell. FIG. 1 shows only four memory cells, for simplicity of illustration, but it should be understood that a typical data storage device, such as a flash memory device, will contain many more cells than illustrated in FIG. 1. The four memory cells in FIG. 1 are designated $A_1$, $A_2$, $A_3$, $A_4$ and represent a grouping of memory cells wherein the set of four cells determines a permutation given by $A=[A_1, A_2, A_3, A_4]$ such that stored charge levels in the cells correspond to a codeword. For example, in FIG. 1, the cell $A_3$ has the highest charge level, as indicated by the cross-hatching within the $A_3$ box. The cell $A_2$ has the next highest charge level, followed by $A_1$ and then by $A_4$. Thus, FIG. 1 represents a permutation of [3, 2, 1, 4].

For devices that store data in accordance with the rank modulation scheme, errors in reading data in the information channel (e.g., transmission errors between the memory cells and decoder) and errors in charge levels will generally involve transpositions of the relative rankings of the cells within a set of cells. For example, a set of cells might have charge levels that provide a stored permutation that might be read as [3, 1, 2, 4] rather than the correct permutation of [3, 2, 1, 4], thereby creating an error. In that erroneous reading, the positions of the "1" cell and the "2" cell are transposed. That is, cell "1" was read as having a greater charge level than cell "2" rather than the correct order, which would have reversed the two.

The rank modulation scheme is especially suited for multilevel cell constructions, such as multilevel flash memory devices. Error correction techniques for multilevel flash memory devices are quite well-known. Such techniques, however, are not very effective for the errors encountered with different modulation schemes, such as the rank modulation scheme. Errors in conventional flash memory devices involve correction of discrete charge level readings from cells. Errors in devices that use a rank modulation data scheme will not involve correction of discrete charge level, but will involve correction of transposition errors in the relative ranking of the cells within a set of cells.

A. Concepts and Motivation for Rank Modulation

As noted above, rank modulation uses the order (i.e., ranks) of cell levels, instead of their actual values. For example, if the charge levels of three cells are $v_1=1.2$, $v_2=1.5$, $v_3=1.0$, then the order of cell levels is [2, 1, 3], meaning that the "2" cell has the highest level and the "3" cell has the lowest level. If their levels are $v_1=1.25$, $v_2=1.48$, $v_3=1.1$, then the order is still [2, 1, 3] even though the actual cell levels have changed. Using cell rank order to represent data makes writing and rewriting much simpler, and the cell levels do not have to take discrete values. Instead, they can be continuous. In the above example, the full order of cell levels is used. As a more general (and powerful) scheme, we can use the partial order of cell levels to represent data.

A rank modulation coding scheme defines a mapping from the (partial) order of a set of cells' levels to data. It also defines a procedure for rewriting data. To change the cell levels from one order to another order, some cells' levels are raised, and they are raised with an important property: when a cell's level is being raised, the only requirement for its targeted level is that the targeted level is higher than some other cell's level. Because of this property, clearly over-programming will never happen in the rank modulation scheme. We will now illustrate rank modulation coding with an example.

Example 1

Figures 2, 3:
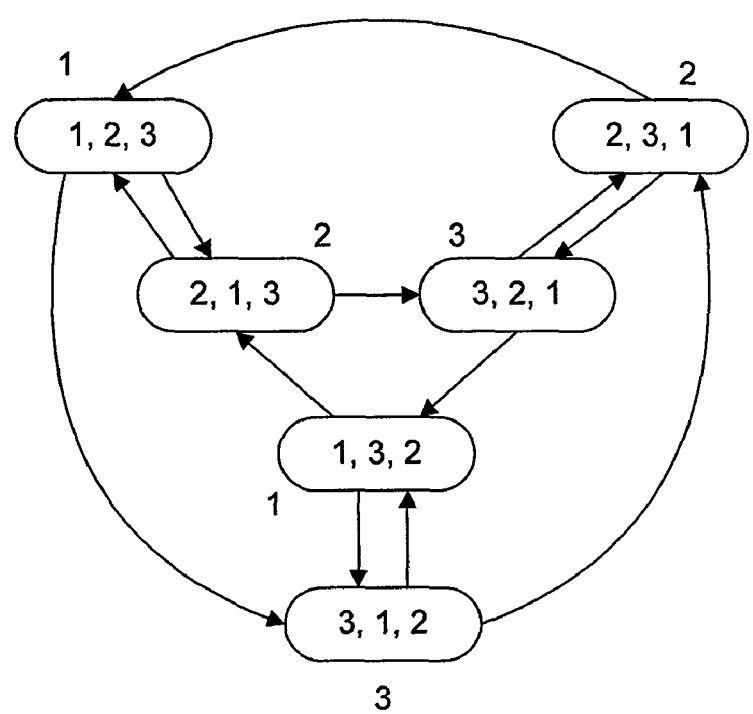
FIG. 2 shows a mapping of cell order to codewords for a rank modulation scheme that uses three cells to represent a ternary variable.
FIG. 3 is a transition diagram that shows a procedure for rewriting in the rank modulation scheme of FIG. 2.
Figures 4A, 4B, 4C:
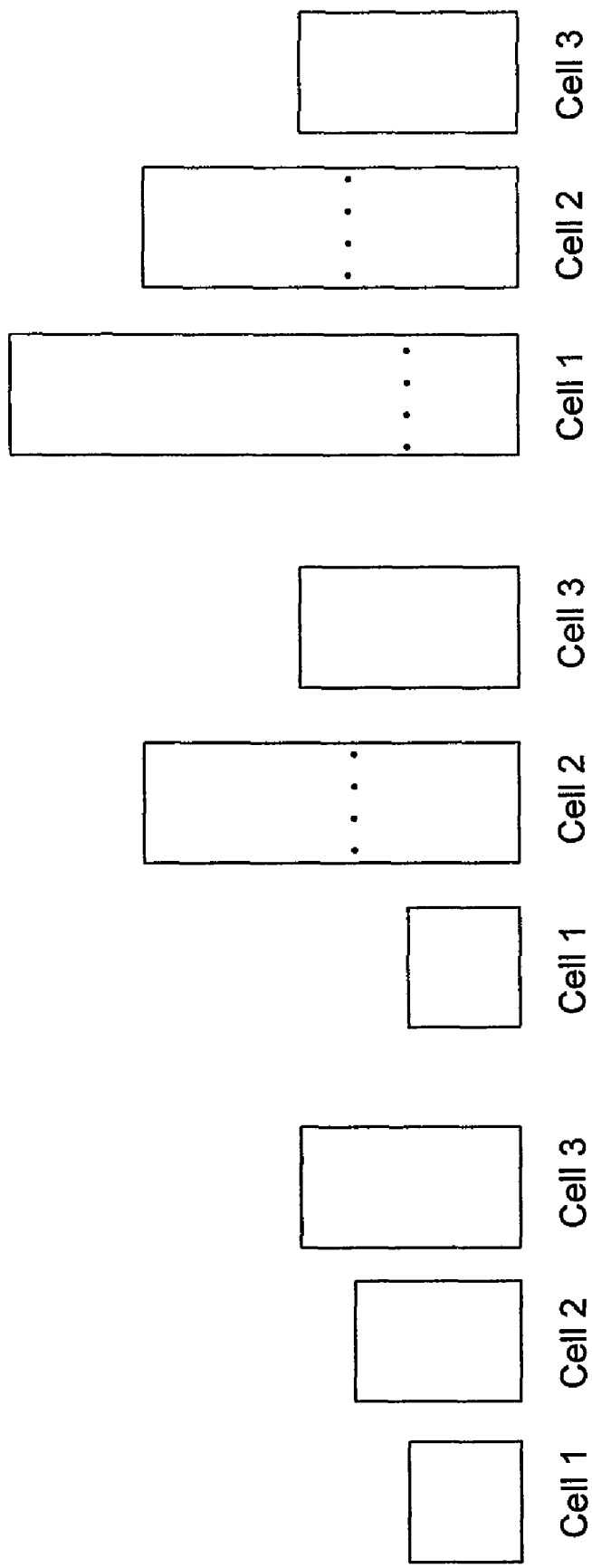
FIGS. 4A, 4B, and 4C represent rewriting in the rank modulation scheme of FIG. 2 according to the procedure of FIG. 3 to provide different codewords and corresponding data values.

FIGS. 2, 3, and 4 illustrate a rank modulation coding scheme that uses three cells to represent a ternary variable. The mapping from the order of cell levels to the variable is shown in FIG. 2. The procedure for rewriting is illustrated in FIG. 3. It is actually relatively simple by examination of the drawings; in a grouping of cells, if a variable's value is changed from i to j, then the j-th cell's level is raised to be the highest level. That is, in the example, if the data to be stored is "1", then the level of the first cell is raised to be the highest level (pushed to the top); if the data to be stored is "2", then the level of the second cell is pushed to the top; if the data to be stored is "3", then the level of the third cell is pushed to the top. An example of rewriting is shown in FIGS. 4A, 4B, and 4C, where the represented variable changes as from 3→2→1, and the order of the cell levels changes as (3, 2, 1)→(2, 3, 1)→(1, 2, 3). FIG. 4A represents (3, 2, 1), with cell "3" having the highest charge; FIG. 4B represents (2, 3, 1); FIG. 4C represents (1, 2, 3). It should be noted that, for each change in ordering (and for each change in variable represented), only one cell is changed in value, so that it becomes the highest level (i.e., is pushed to the top). None of the other cell values are changed during a rewrite operation. The dotted lines represent the original charge levels of the respective cells.

It should be apparent that the data cannot be modified infinitely many times without any block erasure, because there is a finite maximum value for the cell level. The optimization objective of rank modulation coding is to achieve the optimal tradeoff between (1) storage capacity, and (2) the number of times data can be modified before the block erasure is needed. Rank modulation code features related to this objective are described further below and in the above-referenced co-pending U.S. patent application by Anxiao Jiang, et al. (see the U.S. patent application entitled "Rank Modulation for Memory Devices" by A. Jiang et al. filed Nov. 20, 2008).

The advantages of rank modulation coding include: (1) Over-programming cannot happen. Consequently, cells can be safely programmed in a much less conservative way, and the writing speed can be substantially improved. Also, there will be no block erasure caused by over-programming; (2) Tolerating charge leakage. Charge leakage is a major problem for flash memories as it causes all cells to gradually lose charge. Since all the cell levels decrease, it changes the absolute values of cell levels substantially faster than it changes the order of cell levels. Actually, we can even intentionally introduce charge leakage. If it is well controlled, the data will remain unchanged when the cell levels decrease together, and block erasure will be significantly reduced, or possibly totally eliminated. (3) Improving storage capacity. Since cells can tolerate charge leakage better, the margin between cell levels can be set smaller, which improves the storage capacity.

Rank modulation coding provides a new way to program and store data. We can further improve this scheme by using the joint coding of data to improve load balance, and use error-correcting codes to improve data reliability. In addition, we can intentionally use controlled charge leakage to lower the cell levels uniformly without changing their ranks, thus reducing or even eliminating the need to erase blocks for rewriting data. The details on these topics will be further described below.

In this description, error-correcting codes for rank modulation are studied. Even though asymmetric drifts of cell levels are tolerated better by rank modulation, errors can still happen because the cell levels do not necessarily drift at the same rate. The above-referenced patent application (A. Jiang, et al., "Rank Modulation for Memory Devices" filed Nov. 20, 2008) studies Gray codes and encoding/decoding algorithms for the rank modulation scheme.

We explore the properties associated with error-correcting rank-modulation codes. We show that the adjacency graph of permutations for n cells, which is induced by the error model, is a subgraph of a [2×3×...×n] linear array. This observation establishes a general method for designing error-correcting rank-modulation codes using Lee-metric error-correcting codes. We present a single-error-correcting code whose size is at least half of the maximum size. We also present results on additional error-correcting codes and some related bounds.

The rest of the description is organized as follows. In Section II some notations are defined. We continue in Section III, to investigate properties associated with permutations and error correction. In Section IV some code constructions are presented, and in Section V, more results on codes are presented. In Section VI, additional codes and embodiments are described.

II. Definitions and Notation

Let n flash memory cells be denoted by cells numbered 1, 2, ..., n. For $1 \leq i \leq n$, let $C_i \in \Re$ denote the charge level of cell i. The ranks of the n cells is a permutation of $\{1, 2, \ldots, n\}$. If the permutation is $[a_1, a_2, \ldots, a_n]$, then $c_{a_1} > c_{a_2} > \ldots > c_{a_n}$. Here the cell $a_1$ has the highest rank and the cell $a_n$ has the lowest rank.

A rank-modulation scheme uses the ranks (i.e, the permutation) to store information. Let $S_n$ denote the set of n! permutations. Let $Q = \{1, 2, \ldots, q\}$ denote the alphabet of the symbol stored in the n cells. The rank-modulation scheme defines a mapping $D: S_n \to Q$.

Given a permutation, an adjacent transposition is the local exchange of two adjacent elements in the permutation, so that: $[a_1, \ldots, a_{i-1}, a_i, a_{i+1}, a_{i+2}, \ldots, a_n]$ is changed to $[a_1, \ldots, a_{i-1}, a_{i+1}, a_i, a_{i+2}, \ldots, a_n]$.

In this model of representation, the minimal change to a permutation caused by charge-level drift is a single adjacent transposition. We measure the number of errors by the minimum number of adjacent transpositions needed to change the permutation from its original value to its erroneous value. For example, if the errors change the permutation from [2, 1, 3, 4] to [2, 3, 4, 1], the number of errors is two, because at least two adjacent transpositions are needed to change one into the other: $[2, 1, 3, 4] \to [2, 3, 1, 4] \to [2, 3, 4, 1]$.

For two permutations A and B, define their distance, d(A, B), as the minimal number of adjacent transposition; needed to change A into B. This distance measure is called the Kendall Tau Distance in the statistics and machine-learning community, and it induces a metric over $S_n$. See, for example, Kendall M. et al., *Rank correlation methods*, Chapter 1 and Chapter 2, Oxford University Press, NY, (1990). If d(A, B)=1, then A and B are called adjacent. Any two permutations of $S_n$ are at distance at most $$\frac{n(n-1)}{2}$$

from each other. Two permutations of maximum distance are a reverse of each other. The distance between permutations is symmetric and satisfies the triangle inequality, so it is a metric. It equals the number of inversions for the two permutations.

Given the definition of distance, the size of errors (also called the number of errors) can also be defined as follows. Consider rank modulation codes that use the full order of n cell levels to represent data. The full order is a permutation of 1, 2, ..., n, as described earlier. Errors make the permutation change through a sequence of adjacent transpositions. So the size of errors can be defined in the following way. Given two permutations A and B, as described earlier, the distance between them, d(A, B), is defined as the minimum number of adjacent transpositions needed to change one into the other. For example, the distance between (2, 1, 3, 4) and (1, 4, 2, 3) is three, because at least three adjacent transpositions are needed to change one into the other:

(2, 1, 3, 4) ↔ (1, 2, 3, 4) ↔ (1, 2, 4, 3) ↔ (1, 4, 2, 3).

If errors cause a permutation A to become B, we define the size of the errors to be d(A, B).

Figures 5A, 5B, 5C, 5D:
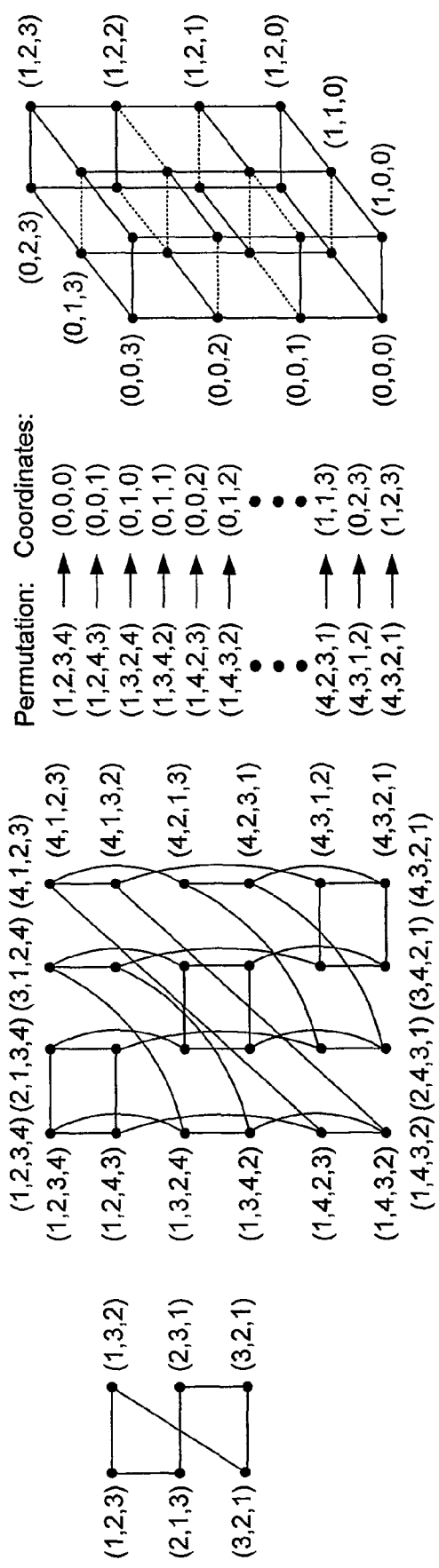
FIGS. 5A, 5B, 5C, 5D show permutation adjacency graphs and corresponding mappings for a variety of cell configurations.

Define the Permutation Transition Graph as follows: the graph has n! vertices, which correspond to the n! permutations; two vertices are adjacent if and only if their distance is one. Two examples of the graph are shown in FIG. 5A and FIG. 5B for n=3 and n=4, respectively. The permutation transition graph will also be referred to as the permutation adjacency graph, and will be described further below.

We have proved the following theorem (in this discussion, theorems, constructions, propositions, and the like will be numbered consecutively).

Theorem 1: The Permutation Transition Graph is a subgraph of a $2 \times 3 \times \ldots \times n$ array.

An example is shown in FIG. 5D for n=4, and the coordinates assigned to the permutation vertices are shown in FIG. 5C. The theorem leads to the following corollary.

Corollary 2: Any $L_1$ error-correcting code in the $2 \times 3 \times \ldots \times n$ array with minimum distance d is also an error-correcting code in the Permutation Transition Graph with minimum distance at least d.

Therefore, $L_1$-metric codes and Lee-metric codes can be used for designing error-correcting rank modulation codes. The construction of error correcting codes for rank modulation coding will be described further below.

III. Properties and Bounds

In this section, we study the distance between permutations and the coordinate representation of permutations. We then study the sizes of balls, and derive an upper bound on the cardinality of error-correcting rank-modulation codes.

Theorem 3. Let $A = [a_1, a_2, \ldots, a_n]$ and $B = [b_1, b_2, \ldots, b_n]$ be two permutations of length n. Suppose that $b_p = a_n$ for some $1 \leq p \leq n$. Let $A' = [a_1, a_2, \ldots, a_{n-1}]$ and $B' = [b_1, \ldots, b_{p-1}, b_{p+1}, \ldots, b_n]$. Then, $$d(A,B) = d(A',B') + n - p.$$

Proof: Let T be a sequence of d(A, B) adjacent transpositions that change A into B. Divide T into two subsequences $T_1$ and $T_2$, such that $T_1$ contains those adjacent transpositions that involve $a_n$, and $T_2$ contains those adjacent transpositions that do not involve $a_n$. (For instance, let us use $t(a_i, a_j)$ to denote an adjacent transposition that exchanges the two numbers $a_i$ and $a_j$. Suppose, for example, A=[2, 3, 1, 4], B=[3, 4, 1, 2], and the minimum number of adjacent transpositions change A into B as $[2, 3, 1, 4] \to [3, 2, 1, 4] \to [3, 2, 4, 1] \to [3, 4, 2, 1] \to [3, 4, 1, 2]$. Then T is t(2, 3), t(1, 4), t(2, 4), t(2, 1), $T_1$ is t(2, 3), t(2, 1), and $T_2$ is t(1, 4), t(2, 4).) Let |T|, $|T_1|$ and $|T_2|$ denote the number of adjacent transpositions in T, $T_1$ and $T_2$, respectively. Clearly, $|T| = |T_1| + |T_2|$.

It is not hard to see that $T_2$ can also change A' into B'. That is because for any $a_i \neq a_n$ and $a_j \neq a_n$, an adjacent transposition in $T_1$, which involves $a_n$, does not change the relative positions of $a_i$ and $a_j$ in A' (and its changed version). Meanwhile, an adjacent transposition $t(a_i, a_j)$ in $T_2$ changes the relative positions of $a_i$ and $a_j$ the same way for A and A'(and their changed versions). Therefore, $|T_2| \geq d(A', B')$. It can also be seen that $|T_1| \geq n-p$, because every adjacent transposition moves an forward in the permutation by one position, and from A to B $a_n$ has moved n−p positions. So $d(A,B) = |T| = |T_1| + |T_2| \geq d(A', B') + n - p$.

Now we show that $d(A, B) \leq d(A', B') + n - p$. Consider such a sequence of $d(A', B') + n - p$ adjacent transpositions: the first $d(A', B')$ of them change $A = [A', a_n]$ into $[B', a_n]$, and the next n−p of them keep moving $a_n$ forward and thus change $[B', a_n]$ into B. So $d(A, B) \leq d(A', B') + n - p$. It follows that $d(A, B) = d(A', B') + n - p$.

The above theorem (Theorem 3) shows a recursive algorithm for computing the distance between two permutations. Let $A = [a_1, a_2, \ldots, a_n]$ and $B = [b_1, b_2, \ldots, b_n]$ be two permutations. For $1 \leq i \leq n$, let $A_i$ denote $[a_1, a_2, \ldots, a_i]$, let $B_i$ denote the subsequence of B that contains only those numbers in $A_i$, and let $p_i$ denote the position of $a_i$ in $B_i$. Then, since $d(A_1, B_1)=0$ and $d(A_i, B_i)=d(A_{i-1}, B_{i-1})+i-p_i$, for $i=2, 3, \ldots, n$, we get $$d(A, B) = d(A_n, B_n) = \frac{(n-1)(n+2)}{2} - \sum_{i=2}^{n} P_i.$$

We now define a coordinate system for permutations. We fix $A=[1, 2, \ldots, n]$. For every permutation $B=[b_1, b_2, \ldots, b_n]$, we define its coordinates as $X_B=(2-p_2, 3-p_3, \ldots, n-p_n)$. Here $p_i$ is defined as above for $2 \leq i \leq n$ regarding the position of $a_i$ in the subsequence $B_i$. Clearly, if $X_B=(x_1, x_2, \ldots, x_{n-1})$, then $0 \leq x_i \leq i$ for $1 \leq i \leq n-1$.

Example 2

Figures 6A, 6B:
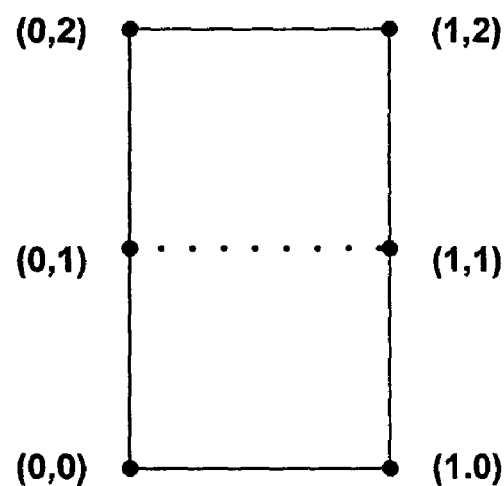
FIGS. 6A and 6B are examples of the permutations adjacency graph for n=3
Figures 7A, 7B:
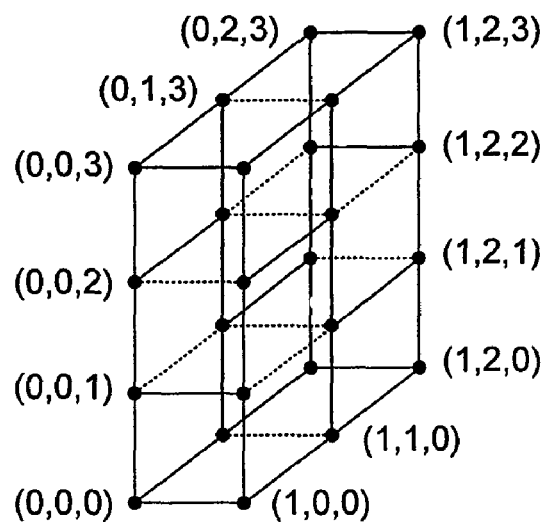
FIGS. 7A and 7B are examples of the permutations adjacency graph for n=4.

Let $A=[1, 2, 3, 4, 5]$. Then $X_A=(0, 0, 0, 0)$. If $B=[3, 4, 2, 1, 5]$, then $X_B=(1, 2, 2, 0)$. If $B=[5, 4, 3, 2, 1]$, then $X_B=(1, 2, 3, 4)$. The full set of permutations and their respective coordinates are shown in FIGS. 6A, 6B for the case of $n=3$ and in FIGS. 7A, 7B for the case of $n=4$.

The details of how to determine coordinates from a permutation will be explained further for $n=5$ in Example 2 above. The example permutation is given as $B=[3, 4, 2, 1, 5]$. For the first subsequence $B_2$, involving "2", the subsequence $B_2$ in the permutation is $[2, 1]$, so $p_2=1$, and $(2-p_2)=1$. For the next subsequence, involving "3", the $B_3$ permutation subsequence is $[3, 2, 1]$, so $p_3=1$, and $3-p_3=2$. For the subsequence involving "4", the $B_4$ subsequence is $[3, 4, 2, 1]$, so $p_4=2$, and $4-p_4=2$. Lastly, for "5", the subsequence is $[3, 4, 2, 1, 5]$, so $p_5=5$, and $5-p_5=0$. Therefore, the coordinates of the permutation $[3, 4, 2, 1, 5]$ are given by $(1, 2, 2, 0)$. For the next case in the example, the example permutation is given as $B=[5, 4, 3, 2, 1]$. For the first subsequence "2", the subsequence $B_2$ in the permutation is "2, 1", so $p_2=1$, and $2-p_2=1$. For "3", the subsequence is "3, 2, 1", so $p_3=1$, and $3-p_3=2$. For "4", the subsequence is "4, 3, 2, 1", so $p_4=1$, and therefore $4-p_4=3$. For "5", the subsequence is "5, 4, 3, 2, 1", so $p_5=1$, and $5-p_5=4$. And therefore the coordinates of the permutation $[5, 4, 3, 2, 1]$ are given by $(1, 2, 3, 4)$, as shown in Example 2.

The notions of permutations and corresponding coordinates lead us to the following useful theorem.

Theorem 4. Two permutations are identical if and only if they have the same coordinates.

Proof: It should be readily apparent that identical permutations will have the same coordinates. For the other direction, let B and B' be two permutations with the same coordinates. By induction, for $i=2, 3, \ldots, n$, since $B_{i-1}$ and $B'_{i-1}$ are identical and $p_i=p'_i$, it follows that $a_i$ has the same position in $B_i$ and $B'_i$, so $B_i$ is identical to $B'_i$. (Here $B_i$, $B'_i$, etc., are defined similarly as before.) That leads to the conclusion.

Theorem 5. Any vector $(y_1, y_2, \ldots, y_{n-1})$, $0 \leq y_i \leq i$ for $1 \leq i \leq n-1$, is a coordinate of some permutation in $S_n$.

Proof: The claim follows easily by noting that there are exactly n! such vectors, and n! permutations (each with a distinct coordinate vector, by the previous theorem).

Let $A \in S_n$ be a permutation. For any $$0 \leq r \leq \frac{n(n-1)}{2},$$

the set $B_r(A)=\{B \in S_n | d(A, B) \leq r\}$ is a ball of radius r centered at A. A simple relabeling argument suffices to show that the size of a ball does not depend on the choice of center. We use $|B_r|$ to denote $|B_r(A)|$ for any $A \in S$. We are interested in finding the value of $|B_r|$. The following theorem presents a way to compute the size of a ball using polynomial multiplication.

Theorem 6. For $$0 \leq r \leq \frac{n(n-1)}{2},$$

let $e_r$ denote the coefficient of $x^r$ in the polynomial $$\prod_{i=1}^{n-1} \frac{x^{i+1}-1}{x-1}. \text{ Then } |B_r| = \sum_{i=0}^{r} e_r.$$

Proof: Let $A=[1, 2, \ldots, n]$. Let $B=[b_1, b_2, \ldots, b_n]$ be a generic permutation. Let $X_B=(y_1, y_2, \ldots, y_{n-1})$ be the coordinates of B. Then by the definition of coordinates, we get $d(A, B)=$ $$\sum_{i=1}^{n-1} y_i.$$

By Theorems 4 and 5, the number of permutations at distance r from A equals the number of integer solutions to $$\sum_{i=1}^{n-1} y_i = r$$

such that $0 \leq y_i \leq i$. That is equal to the coefficient of $x^r$ in the polynomial $$\prod_{i=1}^{n-1} (x^i + x^{i-1} + \ldots + 1) = \prod_{i=1}^{n-1} \frac{x^{i+1}-1}{x-1}.$$

Thus, there are exactly $e_r$ permutations at distance r from A, $$\text{and } |B_r| = \sum_{i=0}^{r} e_r.$$

Polynomial multiplication is a well-studied area, and efficient algorithms exist. Theorem 4 induces an upper bound for the sizes of error-correcting rank-modulation codes. By the sphere-packing principle, for such a code that can correct r errors, its size (number of codewords) cannot exceed $n!/|B_r|$. A higher number of errors correlates with a smaller number of codewords.

IV. Error Correction

Rank modulation coding naturally tolerates errors better in two ways, compared to the traditional approach of using the absolute values of cell levels to represent data. First, the ranks of cell levels are more robust to the charge leakage problem, where all cells gradually lose charge and consequently, their levels all gradually decrease, as discussed earlier. Charge leakage exists in all flash memories, and is a major reliability issue. See, for example, S. Aritome et al., ibid; and P. Cappelletti et al., ibid. However, when the cell levels are lowered together, their ranks do not change as much as their absolute values. In the ideal case, the ranks may not change at all. Second, the ranks can tolerate single-cell errors better. Let Δ denote the minimum margin between two cell levels. If one cell level has an error, then that error has to have a magnitude of Δ or more to change the ranks. If the absolute values of cell levels are used to represent data, then only an error of magnitude Δ/2 or less can be tolerated.

To reliably store data, error correction is an essential function of a storage system. In flash memories, errors can be caused by charge leakage, disturbs, or inaccurate reading. See, for example, S. Aritome et al., ibid; P. Cappelletti et al., ibid; and P. Pavan et al., ibid. Many kinds of errors in flash memories have asymmetric properties, including the charge-leakage problem (a major long-term mechanism that lowers cell levels) and numerous disturb problems. See, for example, S. Aritome et al., ibid; and P. Cappelletti et al., ibid. There are also other errors, including misreading and cell failure. For rank modulation coding, the symptom of errors is that the ranks of cell levels are changed. To correct errors, redundancy must be used.

The following example illustrates the concept of error correction code using the rank modulation scheme. Consider a rank modulation code that uses the full order of four cells' levels to modulate data. The full order is a permutation of 1, 2, 3, and 4. For a permutation, an adjacent transposition is the exchange of positions of two adjacent numbers. For example, for the permutation $\{2, 3, 1, 4\}$, an adjacent transposition can change it to be $\{3, 2, 1, 4\}$, $\{2, 1, 3, 4\}$, or $\{2, 3, 4, 1\}$. Errors cause adjacent transpositions. We study an error-correcting coding scheme that can correct one adjacent transposition, which is a very useful case in practice. The scheme is to use a subset of permutations, called codewords, to modulate data. We can choose the following five codewords:

$\{1, 2, 4, 3\}, \{3, 1, 4, 2\}, \{3, 2, 4, 1\}, \{4, 1, 3, 2\}, \{4, 2, 3, 1\}$

When the error pattern causes an adjacent transposition in a codeword, we say that the distorted permutation is at distance one from the codeword. It is straightforward to verify that any of the 4!=24 permutations is within distance one from at most one of the five codewords. So the code can correct any single adjacent transposition. Error correction is important not only for data reliability, but also for storage capacity and cell programming speed, because there is always a tradeoff between the three. The strongest error-correcting codes can help achieve the optimal tradeoff.

We explore the properties associated with error-correcting rank-modulation codes. We show that the adjacency graph of permutations for n cells, which is induced by the error model, is a subgraph of a [2×3×...×n] linear array. This observation establishes a general method for designing error-correcting rank-modulation codes using Lee-metric error-correcting codes and $L_1$-metric error-correcting codes. We present a single-error-correcting code whose size is at least half of the maximum size. We also present results on additional error-correcting codes and some related bounds.

V. Error-Correcting Rank Modulation Codes

In this section, we first study the topology of permutations, and use the result to derive a general construction for error-correcting rank-modulation codes based on Lee-metric codes and $L_1$-metric codes. Next, we present a family of one-error-correcting codes whose size is at least half of the optimal size.

A. Embedding of Permutation Adjacency Graph

Define the adjacency graph of permutations, $G=(V, E)$, as follows. The graph G has $|V|=n!$ vertices, which represent the n! permutations. Two vertices $u, v \in V$ are adjacent if and only if $d(u,v)=1$. G is a regular undirected graph with degree n−1 and diameter $$\frac{n(n-1)}{2}.$$

To study the topology of G, we begin with the following theorem.

Theorem 7. For two permutations $A=[a_1, a_2, \ldots, a_n]$ and $B=[b_1, b_2, \ldots, b_n]$, let their coordinates be $X_A=(x_1, x_2, \ldots, x_{n-1})$ and $X_B=(y_1, y_2, \ldots, y_{n-1})$. A and B are adjacent if and only if they satisfy the following two conditions:

Condition 1

$$\sum_{i=1}^{n-1} |x_i - y_i| = 1.$$

Condition 2: There do not exist $i, j \in \{1, 2, \ldots, n\}$, where $i \leq j-1$, such that (1) $a_i = b_j$, $a_j = b_i$; (2) for any k where $k \neq i$ and $k \neq j$, $a_k = b_k$; (3) for any k where $i \leq k \leq j$, $a_k > b_i$ and $a_k > b_j$.

Proof. The proof is by induction. When n=2, the theorem is easily true. That serves as the base case. Now assume that the theorem is true for n=2, 3, ..., N−1. We will prove that it is also true when n=N. First, we will show that if the two permutations are adjacent, then $$\sum_{i=1}^{N-1} |x_i - y_i| = 1.$$

Suppose A and B are adjacent. Consider the two integers $z_1, z_2$ such that the $z_1$-th element in A and the $z_2$-th element in B are both N. There are two cases. Case 1: $z_1 = z_2$. In this case, $x_{N-1} = y_{N-1}$ by definition. Since the two permutations are adjacent, which means that we can change one into the other by switching two numbers in adjacent positions, those two positions cannot include $z_1 = z_2$. So if we remove the number N from the two permutations A, B, the two shorter permutations are also adjacent. The coordinates of those shorter permutations are, $(x_1, x_2, \ldots, x_{N-2})$ and $(y_1, y_2, \ldots, y_{N-2})$. By induction, $$\sum_{i=1}^{N-2} |x_i - y_i| = 1.$$

Since $|x_{N-1} - y_{N-1}| = 0$, we get $$\sum_{i=1}^{N-1} |x_i - y_i| = 1.$$

Case 2: $z_1 \neq z_2$. In this case, since A, B are adjacent, A can be changed into B by switching the $z_1$-th number and the $z_2$-th number. Then $|z_1 - z_2| = 1$, and therefore, $|x_{N-1} - y_{N-1}| = 1$, and for any $z \neq z_1, z_2$, we have $x_z = y_z$. So $$\sum_{i=1}^{N-1} |x_i - y_i| = 1.$$

Thus, if the two permutations A and B are adjacent, Condition 1 is true.

If A and B are adjacent, then Condition 2 is also true, for the following simple reason: if the two integers i, j described in Condition 2 exist, then there would be no way to switch $a_i$ and $a_j$ with only one adjacent transposition in order to change A into B. That would be a contradiction.

Now we prove the other direction: if the two conditions are true, then A and B are adjacent. Assume that the two conditions are true. Then, since $$\sum_{i=1}^{N-1} |x_i - y_i| = 1,$$

there are two cases. Case 1: $|x_{N-1}-y_{N-1}|=1$ and for any $z<N-1$, $x_z=y_z$. In this case, by switching the number N and a number beside it in the permutation A, we can get the permutation B. Hence, the two permutations are adjacent. Case 2: $|x_{N-1}-y_{N-1}|=0$ and $$\sum_{i=1}^{N-2} |x_i - y_i| = 1.$$

In this case, if we take away the number N from A and B, we get two shorter permutations satisfying the two conditions, so by induction, the two shorter permutations are adjacent. Assume that we can switch the k-th number and the (k+1)-th number in the first short permutation to get the second short permutation. For both A and B, since Condition 2 is true, the number N cannot be between those switched numbers. So we can still switch those two numbers as an adjacent transposition to change A into B. Thus A, B are adjacent, and the other direction of the conclusion is also true.

Let $L_n=(V_L, E_L)$ denote a $[2\times 3\times \ldots \times n]$ linear array graph. $L_n$ has n! vertices $V_L$. Each vertex is assigned integer coordinates $(x_1, x_2, \ldots, x_{n-1})$, where $0 \leq x_i \leq i$ for $1 \leq i \leq n-1$. The distance between vertices of $L_n$ is the $L_1$ distance, and two vertices are adjacent (i.e., have an edge between them) if and only if their distance is one.

We now build a bijective map P: $V \rightarrow V_L$. Here V is the vertex set of the adjacency graph of permutations G=(V, E). For any $u \in V$ and $v \in V_L$, P(u)=v if and only if u, v have the same coordinates. By Theorem 7, if two permutations are adjacent, their coordinates are adjacent in $L_n$, and we get:

Theorem 8. The adjacency graph of permutations is a subgraph of the $[2\times 3\times \ldots \times n]$ linear array.

Two examples of the permutations adjacency graph for n=3 and n=4 are shown, respectively, in FIGS. 6A, 6B and FIGS. 7A, 7B. In these drawing figures, each vertex is represented by the coordinate assigned to the permutation vertex. The solid lines in the drawing figures are the edges in both the adjacency graph of permutation G and in the $[2\times 3\times \ldots \times n]$ linear array graph $L_n$, while the dotted lines are the edges only in the $[2\times 3\times \ldots \times n]$ linear array graph $L_n$. Thus, FIG. 6B shows how the adjacency graph G for n=3 is embedded in the linear array graph $L_n$. By traversing the FIG. 6B vertices via only the solid lines for the adjacency graph G shows that a change of coordinates in G corresponds to a change in the permutations of FIG. 6A that require only a single adjacency change (that is, one exchange of two adjacent numbers in the permutation to obtain a new permutation). It can be seen that while each permutation has n−1 adjacent permutations, a vertex in the array can have a varied degree from n−1 to 2n−3. Some edges of the array do not exist in the adjacency graph of permutations because they violate Condition 2 in Theorem 7.

Proposition 9. If two vertices are adjacent in the array $L_n$, their distance in the adjacency graph of permutations, G, is at most 2n−3, and this bound is tight.

Proof. Let A and B be two permutations such that $X_A$ and $X_B$ are adjacent in $L_n$. If they are not adjacent permutations, then they must violate Condition 2 in Theorem 7. Without loss of generality, assume $$A=[a_1, \ldots, a_{i-1}, a_i, a_{i+1}, \ldots, a_{j-1}, a_j, a_{j+1}, \ldots, a_n],$$

$$B=[a_1, \ldots, a_{i-1}, a_j, a_{i+1}, \ldots, a_{j-1}, a_i, a_{j+1}, \ldots, a_n].$$

Clearly, a minimum of (j−i)+(j−i−1)=2j−2i−1 adjacency transpositions are needed to switch $a_i$ and $a_j$ in order to change A into B. When i=1, j=n, 2j−2i−1 reaches the maximum value 2n−3. Hence, $d(A, B) \leq 2n-3$. To see that the bound is tight, consider A=[1, 3, 4, ... n, 2] and B=[2, 3, 4, ..., n, 1].

The observation above that the adjacency graph for a permutation is a subgraph of a linear array shows an approach to designing error-correcting rank-modulation codes based on Lee-metric codes and L1-metric codes. We skip its proof due to its simplicity.

Theorem 10. Let C be a Lee-metric or $L_1$-metric error-correcting code of length n−1, alphabet size no less than n, and minimum distance d. Let C' be the subset of codewords of C that are contained in the array $L_n$. Then C' is an error-correcting rank-modulation code with minimum distance at least d.

Thus, the discussion above shows that codes (sets of codewords) can be generated for rank modulation schemes by generating coordinates of permutations having a desired permutation size n, such that the coordinates can be generated according to the number r of errors in a codeword that the code is desired to correct. The coordinates provide a topology based solution for selecting error correcting codewords. For codes generated in this manner, verifying the validity of a codeword can be achieved by verifying the validity of the corresponding coordinates of the codeword.

Single-error-correcting Rank-Modulation Code

We now present a family of rank-modulation codes that can correct one error. The code is based on the perfect sphere packing in the Lee-metric space. See, for example, Golomb, S. W. et al., *SIAM J. Appl. Math.*, 18(2):302-317 (January 1970). The code construction is as follows.

Construction 11. (Single-error-correcting rank-modulation code) Let $C_1$, $C_2$ denote two rank-modulation codes constructed as follows. Let A be a general permutation whose coordinates are $(x_1, x_2, \ldots, x_{n-1})$. Then A is a codeword in $C_1$ if and only if the following equation is satisfied.

$$\sum_{i=1}^{n-1} ix_i \equiv 0 (\bmod 2n-1).$$

A is a codeword in $C_2$ if and only if the following equation is satisfied:

$$\sum_{i=1}^{n-2} ix_i + (n-1) \cdot (-x_{n-1}) \equiv 0 (\text{mod } 2n-1).$$

Between $C_1$ and $C_2$, choose the code with more codewords as the final output.

We analyze the code size of a code generated from using Construction 11.

Lemma 12. The rank-modulation code built in Construction 11 has a minimum cardinality of $$\frac{(n-1)!}{2}.$$

Proof. Let $H=(V_H, E_H)$ be a $[2\times3\times \ldots \times(n-1)\times(2n-1)]$ linear array. Every vertex in H has integer coordinates $(x_1, x_2, \ldots, x_{n-1})$, where $0 \leq x_i \leq i$ for $1 \leq i \leq n-2$, and $-n+1 \leq x_{n-1} \leq n-1$.

Given any choice of $(x_1, x_2, \ldots, x_{n-2})$ of the coordinates, we would like to see if there is a solution to $x_{n-1}$ (note that $-n+1 \leq x_{n-1} \leq n-1$) that satisfies the following equation:

$$\sum_{i=1}^{n-1} ix_i \equiv 0 (\text{mod } 2n-1)$$

Since $$\sum_{i=1}^{n-1} ix_i = (n-1)x_{n-1} + \sum_{i=1}^{n-2} ix_i,$$

and $2n-1$ are co-prime integers, there is exactly one solution to $x_{n-1}$ that satisfies the above equation. If $x_{n-1} \geq 0$, clearly $(x_1, x_2, \ldots, x_{n-1})$ are the coordinates of a codeword in the code $C_1$. If $x_{n-1} \leq 0$, then, $$\sum_{i=1}^{n-2} ix_i + (n-1) \cdot [-(-x_{n-1})] \equiv 0 (\text{mod } 2n-1),$$

so $(x_1, x_2, \ldots, x_{n-2}, -x_{n-1})$ are the coordinates of a codeword in the code $C_2$.

Since $0 \leq x_i \leq i$ for $1 \leq i \leq n-2$, there are $(n-1)!$ ways to choose $x_1, x_2, \ldots, x_{n-2}$. Each choice generates a codeword that belongs either to $C_1$ or $C_2$. Therefore, at least one of $C_1$ and $C_2$ has cardinality no less than $$\frac{(n-1)!}{2}.$$

Lemma 13. The rank-modulation code built in Construction 11 can correct one error.

Proof. It has been shown that for an infinite k-dimensional array, vertices whose coordinates $(x_1, x_2, \ldots, x_k)$ satisfy the condition $$\sum_{i=1}^{k} ix_i \equiv 0 (\text{mod } 2k+1)$$

have a minimum $L_1$ distance of 3. Let $k=n-1$. See, for example, Golomb, S. W. et al., ibid. Note that in Construction 11, the codewords of $C_1$ are a subset of the above vertices, while the codewords in $C_2$ are a subset of the mirrored image of the above vertices, where the last coordinate $x_{n-1}$ is mapped to $-x_{n-1}$. Since the adjacency graph of the permutations is a subgraph of the array, the minimum distance of $C_1$ and $C_2$ is at least three. Hence, the code built in Construction 11 can correct one error.

Theorem 14. The code built in Construction 11 is a single-error-correcting rank-modulation code whose cardinality is at least half of optimal.

Proof. Every permutation has n-1 adjacent permutations, so the size of a radius-1 ball, $|B_r|$, is n. By the sphere packing bound, a single-error-correcting rank-modulation code can have at most $$\frac{n!}{n} = (n-1)!$$

codewords. The code in Construction 11 has at least $(n-1)!/2$ codewords.

VI. More Codes and Embodiments

It has been shown that the single-error-correcting code built by Construction 11 has a size within half of optimal. There exist code constructions that can build larger codes in many cases. We report here some error correcting codes built using ad hoc constructions, and compare them with the sphere-packing upper bound and the half-optimal code:

When n=3, a single-error-correcting code with two codewords—[1, 2, 3] and [3, 2, 1]—can be easily found. The same code is built by Construction 11, and the size meets the sphere-packing upper bound.

When n=4, an ad hoc construction generates a single-error-correcting code with five codewords: [1, 2, 4, 3], [3, 1, 4, 2], [3, 2, 4, 1], [4, 1, 3, 2] and [4, 2, 3, 1]. The code output by Construction 10 has size four. The sphere-packing bound is six. It can be shown that the code of size five is optimal.

When n=5, 6, 7, an ad hoc construction generates single-error-correcting codes with 18, 90, and 526 codewords, respectively. The codes output by Construction 11 have size 14, 66, and 388, respectively. The sphere-packing upper bound is 24, 120, and 720, respectively.

When n=5, 6, 7, there exist two-error-correcting codes of size 6, 23, and 110, three-error-correcting codes of size 2, 10, 34, and four error-correcting codes of size 2, 4, and 14, respectively. All the above codes have a size that is at least one half of the optimal size.

The ad hoc techniques can be implemented as operations that provide a "brute force" methodology that iteratively generates and tests permutations for suitability as error correcting codes. Permutations are suitable only if they correct a desired number of errors in a transmitted codeword. That is, only permutations that have a distance from all other permutations that is greater than or equal to (2r+1) are retained, wherein the retained generated permutations comprise a rank modulation codeword alphabet that defines a modulation code capable of correcting r errors in a transmitted codeword. All other generated permutations that are less than (2r+1) from other permutations, will be eliminated as codewords for error correction. Those skilled in the art will understand how such ad hoc schemes can be implemented, in view of the description herein.

Conventional desktop or laptop computers can be used for generating permutations and testing them via the ad hoc techniques. It has been found that ad hoc techniques for generating error correcting codes suitable for use with rank modulation schemes can require as little as one or two minutes to generate suitable error correcting codes for 3-cell or 4-cell permutations, but can require upwards of seven hours or more for ad hoc generating of codes suitable for 7-cell permutations (that is, where the codeword permutations A comprise permutations $A=[A_1, A_2, A_3, \ldots, A_7]$. In contrast, the technique of Construction 11 can provide a suitable error correcting code in a matter of minutes, even for memory device constructions on the order of seven cells or more. Thus, the methodology of Construction 11 is much more efficient at generating error correcting codes for use with rank modulation schemes.

Figure 8:
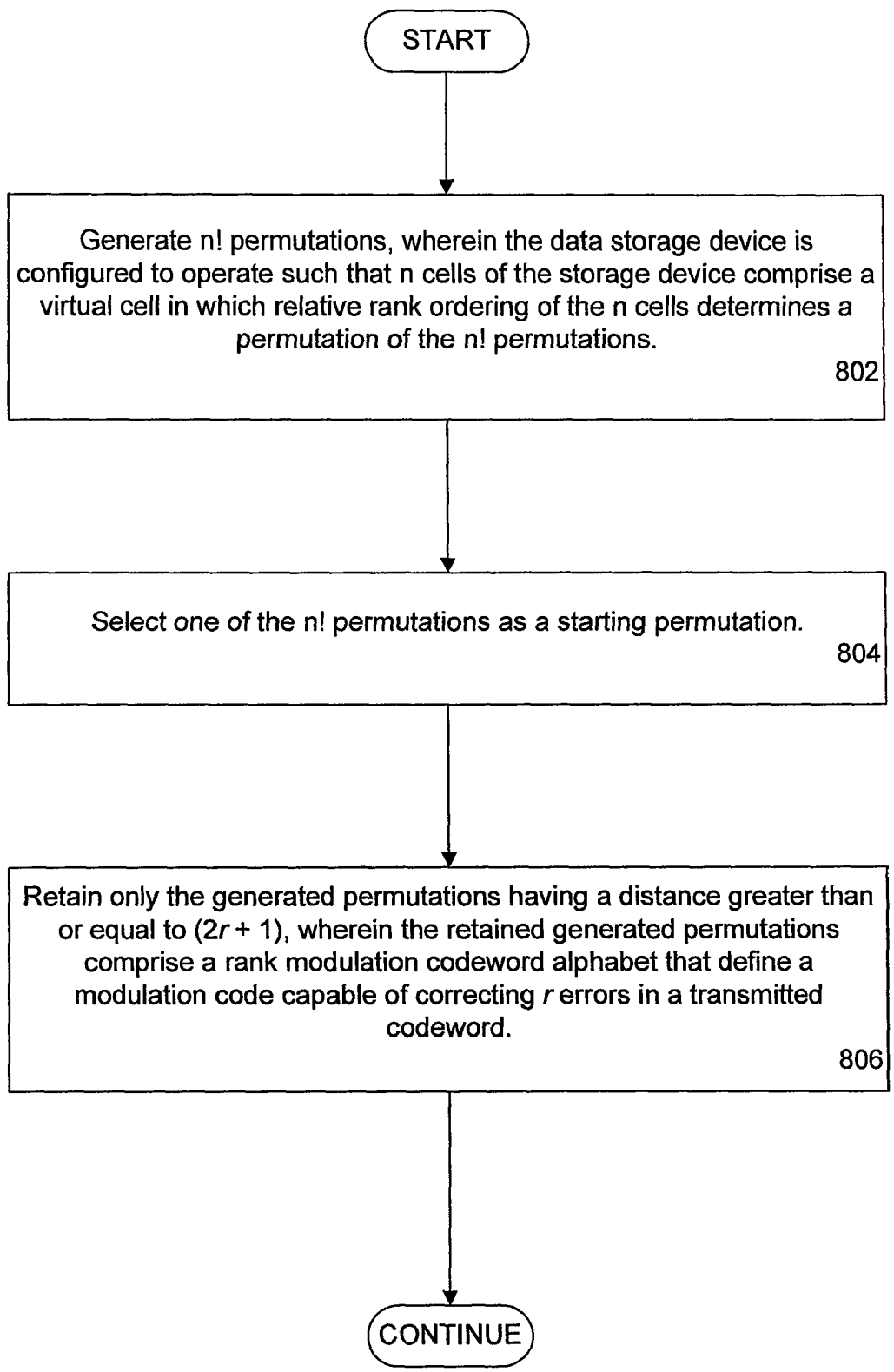
FIG. 8 shows the operations performed for generating a rank modulation code that is suitable for correcting r errors in a code constructed starting with n! permutations.

FIG. 8 shows the operations performed for generating a rank modulation code that is suitable for correcting r errors in a code constructed starting with n! permutations. In the first operation, indicated by the flow diagram box numbered 802, the n! permutations are generated. Thus, the codeword alphabet will be suitable for use with a data storage device that is configured to operate such that n cells of the storage device comprise a virtual cell in which relative rank ordering of the n cells determines a permutation of the n! permutations. As noted above, not all the possible n! permutations will be suitable for the codeword alphabet and not all of the n! permutations will be used.

In the next operation, indicated by the FIG. 8 box numbered 804, one of the n! permutations is selected as a starting permutation. In the technique of Construction 11, the starting permutation is generally a permutation corresponding to a relative ranking of the cells in sequence. That is, for an n-cell codeword alphabet A, the starting permutation of A will be given by $[A_1, A_2, A_3, \ldots, A_n]$, which corresponds to the first cell of a group having the highest relative charge, or rank, with the second cell of the group having the next highest charge, and so forth, for a cell construction such as illustrated in FIG. 1. The starting permutation then has a corresponding coordinate $X=(x_1, x_2, \ldots, x_n)$ in the adjacency permutation graph that is equal to $X=(0, 0, \ldots, 0)$. In the case of the ad hoc technique for generating an alphabet, the starting permutation may be arbitrarily chosen. It is generally convenient to select the same starting permutation as the Construction 11 technique.

The Construction 11 technique generates coordinates of the permutations such that the coordinates can be tested to determine if they satisfy the conditions for indicating a valid codeword. These conditions are the summations expressions described above. Thus, the operation of box 804 in using the Construction 11 technique performs operations that include generating a coordinate set $X_B=(x_1, x_2, \ldots, x_{n-1})$ for a permutation B of the n cells according to an initial permutation $A=[a_1, a_2, \ldots, a_n]=[1, 2, \ldots, n]$ and the permutation $B=[b_1, b_2, \ldots, b_n]$ wherein for $1 \leq i \leq n$, the permutation $A_i$ denotes a subsequence of the permutation A such that $A_i=[a_1, a_2, \ldots, a_i]$, $B_i$ denotes a subsequence of permutation B that contains only those numbers in $A_i$, and $p_i$ denotes the position of $a_i$ in $B_i$, then for every permutation $B=[b_1, b_2, \ldots, b_n]$ and the coordinates of the coordinate set $X_B$ are given by $X_B=(2-p_2, 3-p_3, \ldots, n-p_n)$ for $2 \leq i \leq n$. Next, B is determined to be a codeword in a first codeword alphabet $C_1$ if and only if:

$$\sum_{i=1}^{n-1} ix_i \equiv 0 (\mod 2n-1)$$

and B is determined to be a codeword in a second codeword alphabet $C_2$ if and only if $$\sum_{i=1}^{n-2} ix_i + (n-1) \cdot (-x_{n-1}) \equiv 0 (\mod 2n-1).$$

The operations of generating and determining are repeated for the n values.

In the next operation, indicated by the box numbered 806, only the generated permutations having a distance greater than or equal to (2r+1) are retained as codewords, wherein the retained generated permutations comprise a rank modulation codeword alphabet that define a modulation code capable of correcting r errors in a transmitted codeword. In the Construction 11 technique, the operation of retaining in box 806 is carried out by selecting either the first alphabet $C_1$ or the second alphabet $C_2$ as the set of permutations B according to the alphabet containing the greater number of codewords.

The operations of FIG. 8 for generating a suitable error correcting code may be performed by a conventional desktop, server, or laptop computer or the like available today. For example, any computer system capable of supporting an operating environment such as one of the "Windows" series of operating systems by Microsoft Corporation or the "Macintosh" operating systems by Apple, Inc., and various UNIX and Linux distributions, will have sufficient computing resources to perform the functions described herein for generating error correction codes in rank modulation schemes. A software application for generating a suitable code typically receives as input the parameters necessary to specify the error correcting code, in particular, the desired n and r parameters for alphabet size and number of errors to be corrected, respectively. Those skilled in the art will understand how to provide a suitable user interface to receive such parameters. The operations of FIG. 8 are then performed using the received n and r parameters.

Figure 9:
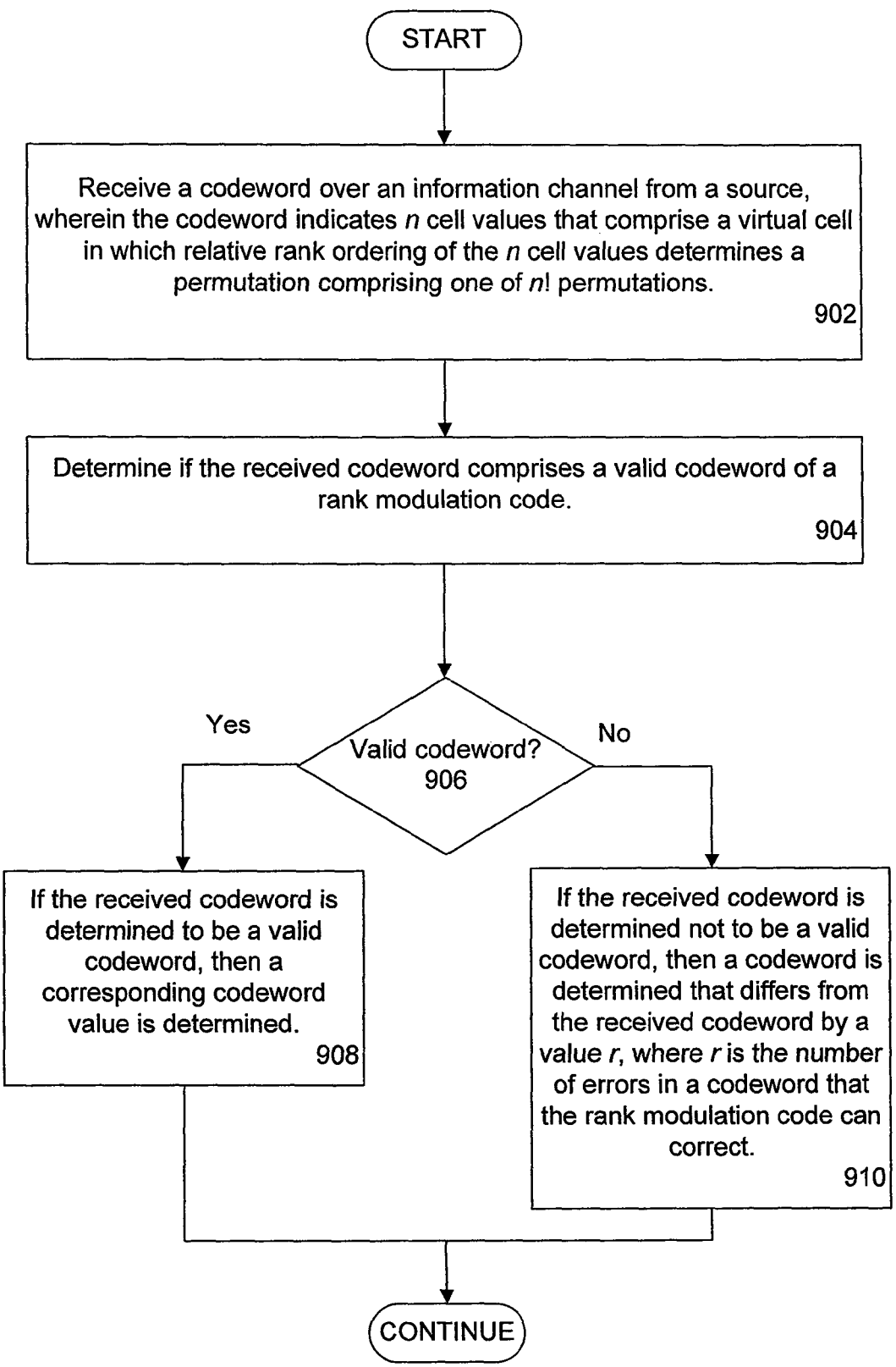
FIG. 9 is a flow diagram that shows the operations performed by a device for decoding a codeword received over an information channel.

FIG. 9 is a flow diagram that shows the operations performed by a device for decoding a codeword received over an information channel. The device may comprise an external memory device such as a flash memory device that stores data in accordance with the rank modulation technique, or the device may comprise a device that incorporates memory that is implemented in accordance with the rank modulation technique. The device may comprise a decoder for the purpose of determining data values that correspond to the received codeword. The FIG. 9 operations will compensate for noise in the channel by determining the likely codeword alphabet (permutation) that corresponds to the received symbol.

In the first operation, indicated by the flow diagram box numbered 902, the device receives a rank modulation codeword. The receiving operation generally comprises receiving a codeword over an information channel from a source, wherein the codeword indicates n cell values that comprise a virtual cell in which relative rank ordering of the n cell values determines a permutation comprising one of n! permutations. The information channel may comprise a variety of constructions, such as a data bus in a computing device, a circuit connection with a source of the codeword, or a data connection between a source and the decoder, or a wireless communication link between the source and the decoder, as described further below.

In the next operation, represented by the box 904, the device determines if the received codeword comprises a valid codeword of the rank modulation code. If the rank modulation code incorporating error correction as described herein was generated according to a code construction technique such as the Construction 11 technique, then determining a valid codeword can conveniently involve a reverse operation to determine if the codeword under investigation satisfies the conditions for having been generated by the code construction technique. For example, if the codeword was generated using the Construction 111 technique to correct r errors where r=1, then the device can determine if the received codeword satisfies the Construction 11 conditions for being a valid coordinate such as given by the adjacency permutation graph. Other validation-determining schemes have been described above, such as validation of coordinate representations and table look-up techniques, all of which may be performed for the box 904 operations.

Exemplary details of the operations of box 904 are as follows. For a rank modulation scheme using codewords generated according to Construction 11, to verify that a received codeword permutation comprises a valid codeword, the operations of box 904 utilize the fact that a permutation is a valid codeword if and only if it satisfies the equation in Construction 11 (the construction for "single-error-correcting" rank modulation code). Two equations are given in Construction 11, but only one equation is followed to define the error correction code, as noted in Construction 11 above. In this example, it will be assumed that the first equation was used to define the codewords:

$$\sum_{i=1}^{n-1} ix_i \equiv 0 (\text{mod } 2n-1).$$

Those of skill in the art will readily understand how to determine valid codewords if the alternate equation of Construction 11 was used to generate the code. For this example, assume n=5. Thus, the permutations of the received codewords will be given by A, where $A=[a_1, a_2, a_3, a_4, a_5]$ and the coordinates will be given by X, where $X=(x_1, x_2, x_3, x_4)$ Assume the received codeword is a permutation given by [5, 1, 3, 2, 4]. The coordinates of the permutation are given by (0, 1, 0, 4). That is, $x_1=0, x_2=1, x_3=0, x_4=4$. So the summation expression from the first condition of Construction 11 evaluates to: 1×0+2×1+3×0+4×4=18=0 (mod 9). Thus, the evaluation of the received codeword [5, 1, 3, 2, 4] equals zero and therefore it satisfies the equation from Construction 11 and is a valid codeword.

Next, assume the received codeword is a permutation given by [5, 3, 1, 2, 4]. The coordinates of the permutation are (0, 2, 0, 4). That is, $x_1=0, x_2=2, x_3=0, x_4=4$. So the summation expression from Construction 11 evaluates to: 1×0+2×2+3×0+4×4=20=2 (mod 9). Thus, the received codeword [5, 3, 1, 2, 4] does not satisfy the equation and therefore it is not a valid codeword.

The next operation illustrated in FIG. 9, the decision box 906, represents the device determination as to whether the received codeword is a valid codeword. If the received codeword is determined to be valid, a "yes" outcome at box 906, then operation proceeds to box 908, where the corresponding value of the codeword can be determined and further operations can be continued. Typically, valid codewords are mapped to predetermined corresponding values, such that simple table look-up techniques can be used to retrieve the proper value. Other operations may be carried out to retrieve the proper values to which valid codewords are mapped, in accordance with the rank modulation scheme for the information channel.

If the received codeword is determined not to be a valid codeword, a "no" outcome at the decision box 906, then operation proceeds to box 910, where a valid codeword is determined by checking against permutations that differ from the received codeword by a value r, where r is the number of errors in a codeword that the rank modulation code can correct. That is, a codeword is determined to be valid or not valid, and if determined to be not valid, a corrected codeword can be determined in place of the received codeword. We next describe an example of the box 910 processing.

Continuing with the example above, where the received codeword [5, 3, 1, 2, 4] was found not to be valid, a correct codeword must be determined. Recall that the received codeword [5, 3, 1, 2, 4] corresponds to coordinates (0, 2, 0, 4). To correct the received codeword, we check the valid coordinates that differ from (0, 2, 0, 4) by one (plus one or minus one, being +/−r). Recall that valid coordinates have the property that the first position can only assume the values (0, 1), the second position can only assume the values (0, 1, 2), the third position can only assume the values (0, 1, 2, 3), and so forth. That is, for a coordinate X, the nth coordinate must be selected from (0, 1, 2, ..., n) so that the $x_n$ coordinate position cannot be greater than n. Therefore, the valid coordinates to be checked for this example comprise the set (1, 2, 0, 4), (0, 1, 0, 4), (0, 2, 1, 4), and (0, 2, 0, 3). The operations comprising box 906 include such checking for valid coordinates.

For the first candidate set of coordinates (1, 2, 0, 4) that might be used to replace the received permutation, the summation expression from Construction 11 evaluates to 1×1+2×2+3×0+4×4=21=3 (mod 9). Thus, the result is non-zero and therefore the coordinate set (1, 2, 0, 4) is not a valid codeword. For the second set of coordinates (0, 1, 0, 4), the summation expression from Construction 11 evaluates to 1×0+2×1+3×0+4×4=18=0 (mod 9). So the coordinate set (0, 1, 0, 4) corresponds to a valid codeword. According to the Construction 11 technique, (0, 1, 0, 4) is the only possible valid set of coordinates for the received codeword and the process for determining a corrected codeword is complete. For purposes of illustration, the remaining coordinates will be checked. For (0, 2, 1, 4), the summation expression from Construction 11 evaluates to 1×0+2×2+3×1+4×4=23=5 (mod 9). So it is not a valid codeword. For (0, 2, 0, 3), the summation expression from Construction 11 evaluates to 1×0+2×2+3×0+4×3=16=7 (mod 9). So it is not a valid codeword. So of the four possibilities considered for this example, the only valid "neighboring coordinates" for the received permutation are (0, 1, 0, 4), which corresponds to the permutation (5, 1, 3, 2, 4). Therefore, the processing of box 906 according to this example shows that, if we receive the permutation (5, 3, 1, 2, 4) over the information channel, we can easily determine that the received permutation is invalid and we can check the set of possible valid coordinates and identify the correct neighboring coordinates (0, 1, 0, 4) and then determine the corresponding valid permutation (5, 1, 3, 2, 4).

In this way, the operation of box 910 shows that if the received codeword was determined to be a valid codeword, then a corresponding value for the permutation is determined, and if the received codeword is determined not to be a valid codeword, then a codeword is determined that differs from the received codeword by a value r, where r is the number of errors in a codeword that the rank modulation code can correct. Processing of the device then continues with other operations.

In general, the processing of FIG. 9 for decoding a codeword may be described as involving receiving the codeword from a storage device memory that is configured to operate such that n cells of the storage device comprise a virtual cell in which relative rank ordering of the n cells determines a permutation comprising one of n! permutations; that is, the memory is operated according to a rank modulation scheme as described herein. Next, the FIG. 9 processing determines if the received codeword comprises a valid codeword of a rank modulation code, wherein if the received codeword is determined to be a valid codeword, then the device determines a corresponding value for the codeword. If the received codeword is determined not to be a valid codeword, then the device determines a codeword that differs from the received codeword by a value r, where r is the number of errors in a codeword that the rank modulation code can correct.

Figure 10:
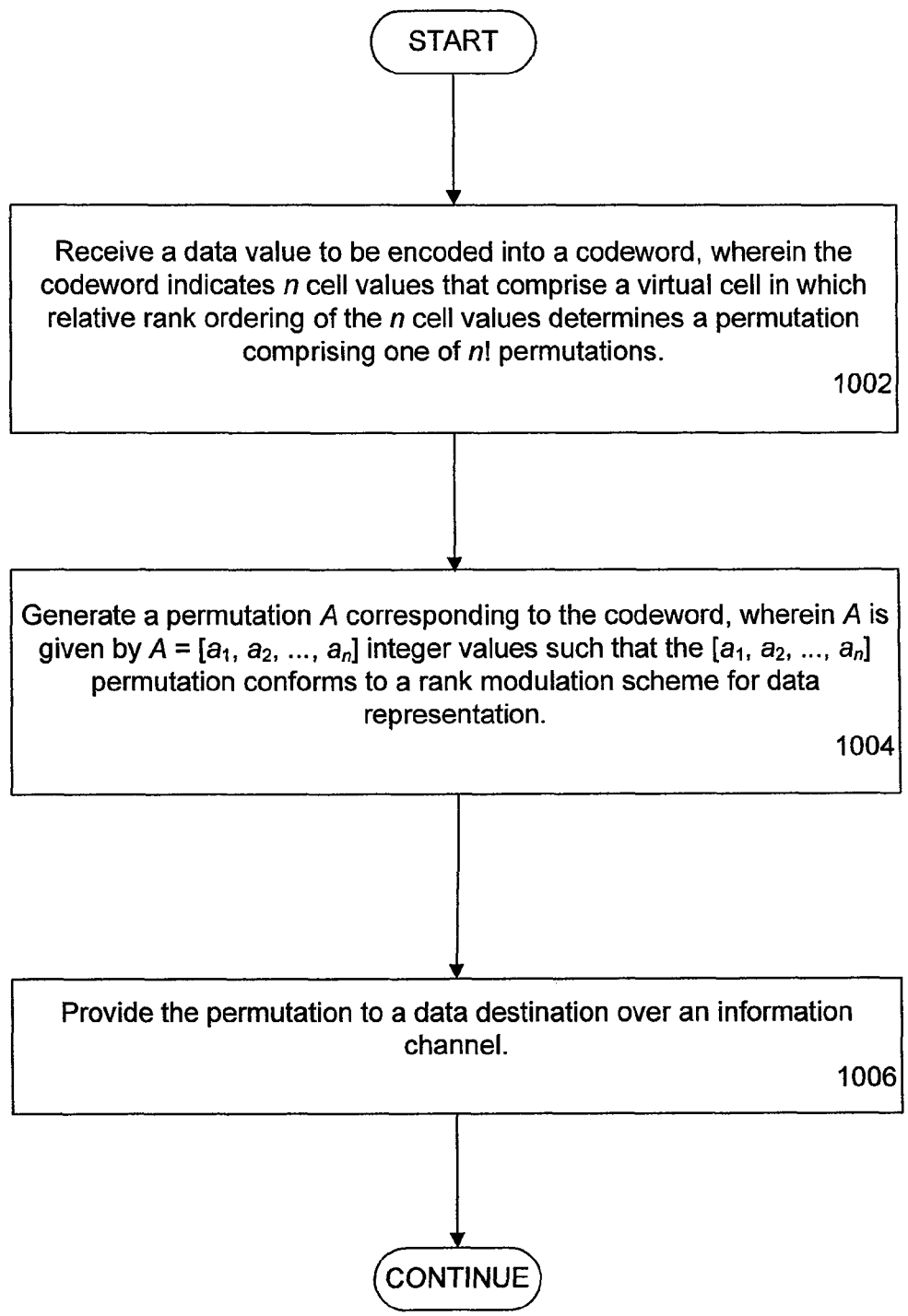
FIG. 10 is a flow diagram that shows the operations performed by a device for encoding a data value for transmitting over an information channel.

FIG. 10 is a flow diagram that shows the operations performed by a device for encoding a data value to be encoded into a codeword. The device may comprise an external data storage device such as a flash memory device that receives data from a host device, such as a computer, and stores the data in accordance with the rank modulation technique, or the device may comprise a device that incorporates memory implemented in accordance with the rank modulation technique. For example, the device may comprise a computer or other processor device provided with semiconductor memory organized according to the rank modulation scheme, or the device may comprise an encoder for the purpose of processing data values and producing corresponding codewords.

In the first operation, represented by the flow diagram box 1002, a data value to be encoded into a codeword is received, wherein the codeword indicates n cell values that comprise a virtual cell in which relative rank ordering of the n cell values determines a permutation comprising one of n! permutations. The data is generally received over an information channel from a source, wherein the codeword indicates n cell values that comprise a virtual cell in which relative rank ordering of the n cell values determines a permutation comprising one of n! permutations. The source may comprise, for example, a host computer or memory of a device or a transmitter of data. The information channel may comprise a variety of constructions, such as a data bus in a computing device, a circuit connection, or a data connection between a source and the encoder, or a wireless communication link between the source and the encoder, as described further below.

In the next encoding operation, indicated by box 1004, a permutation A is generated corresponding to the codeword, wherein A is given by $A=[a_1, a_2, \ldots, a_n]$ integer values such that the $[a_1, a_2, \ldots, a_n]$ permutation conforms to a rank modulation scheme for data representation. At box 1006, the permutation is provided to a data destination over the information channel. For example, the permutation may be stored into memory cells of a data device, or provided to memory of a host device, or transmitted to an external destination. Processing of the device then continues with other operations.

The encoding operations may be performed using lookup table techniques. Consider a data value received for storing into a storage device configured to operate according to a rank modulation scheme. For example, in FIGS. 2, 3, and 4, a data value of "3" was mapped to the permutation [3, 2, 1]. Thus, the storage device may receive a data value of "3" and may check a lookup table of the storage device to determine that "3" maps to [3, 2, 1]. The storage device will therefore adjust appropriate memory cell levels to correspond to the [3, 2, 1] permutation. Though in the example of FIGS. 2, 3 and 4, each data value is mapped to two permutations, it should be apparent that for the error-correcting rank modulation codes, to maximize the storage capacity, every codeword can be mapped to a distinct data value. For the error-correcting code generated using the Construction 11 technique, the codewords can be ordered alphabetically either according to their coordinates $[x_1, x_2, \ldots, x_{n-1}]$ or according to their permutations $[b_1, b_2, \ldots, b_n]$, to allow efficient lookup of the codewords and the data values they represent.

Figure 11:
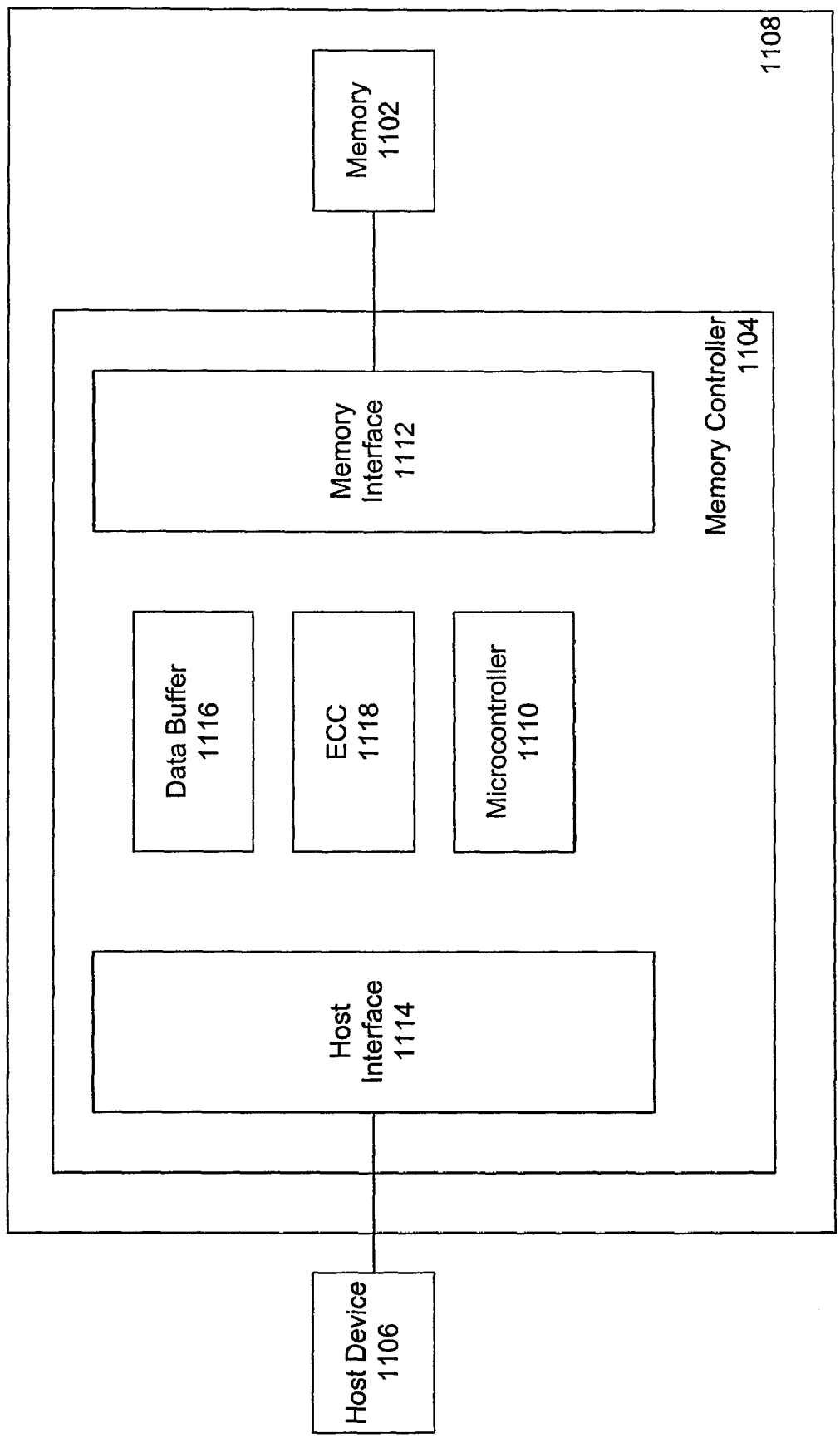
FIG. 11 is an illustration of a memory device constructed in accordance with the present invention.

FIG. 11 is an illustration of a memory device constructed in accordance with the present invention. FIG. 11 shows a memory 1102 that is accessed by a memory controller 1104 that communicates with a host device 1106. The memory 1102 is used for storing data that is represented in accordance with a rank modulation coding scheme. The memory may be implemented, for example, as a Flash memory having multi-level cells. The memory 1102 and memory controller 1104 together comprise a memory device 1108 that may be external to the host device or may be integrated with the host device into a single component or system. For example, the memory device 1108 may comprise a Flash memory device that communicates with a host computer via a USB connection. Alternatively, the memory device may be integrated with a suitable host device to comprise a single system or component, such as a smart phone or network router or MP3 player or the like.

The memory controller 1104 operates under control of a microcontroller 1110, which manages communications with the memory 1102 via a memory interface 1115 and manages communications with the host device via a host interface 1114. Thus, the memory controller supervises data transfers from the host 1106 to the memory 1102 and from the memory 1102 to the host 1106. The memory controller 1104 also includes a data buffer 1116 in which data values may be temporarily stored for transmission over the data channel connection between the memory 1102 and the host 1106. The memory controller also includes an ECC block 1118 in which data for the ECC is maintained. For example, the ECC block 1118 may comprise data and program code to perform the error correction operations of FIG. 9 using the error-correcting code generated as described herein. The ECC block 1118 may contain parameters for the error correction code to be used for the memory 1102, such as programmed operations for translating between received symbols and error-corrected symbols, or the ECC block may contain lookup tables for codewords or other data, or the like. The memory controller 1104 performs the operations described above for decoding data, such as illustrated in FIG. 9, and performs the operations described above for encoding data, such as illustrated in FIG. 10.

Figure 12:
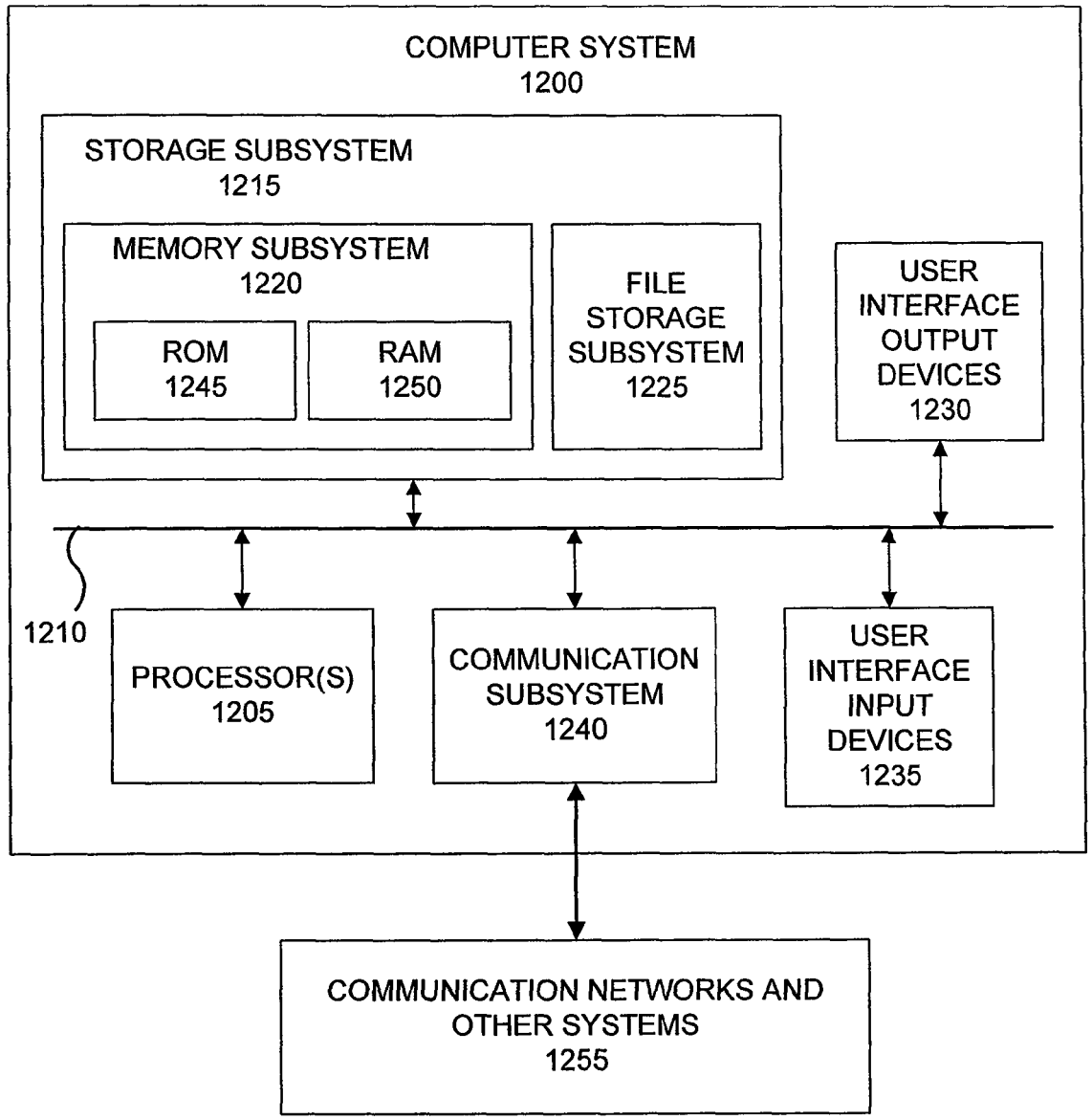
FIG. 12 is a block diagram of a computer apparatus to perform the code generating operations of FIG. 8 and for communicating with a memory device such as depicted in FIG. 10.

An error correcting code as described herein can be generated from the operations depicted in FIG. 8, which can be performed by a conventional computer apparatus. The processing components such as the controller 1104 and microcontroller 1110 may be implemented in the form of control logic in software or hardware or a combination of both, and may comprise processors that execute software program instructions from program memory, or as firmware, or the like. The host device 1106 may comprise a conventional computer apparatus. A conventional computer apparatus also may carry out the operations of FIGS. 8, 9, and 10. FIG. 12 is a block diagram of a computer apparatus 1200 sufficient to perform as a host device and sufficient to perform the operations of FIG. 8. In addition, the computer apparatus can comprise the host device for communicating with a memory device such as depicted in FIG. 11.

FIG. 12 is a block diagram of a computer system 1200 that may incorporate embodiments of the present invention and perform the operations described herein. The computer system 1200 typically includes one or more processors 1205, a system bus 1210, storage subsystem 1215 that includes a memory subsystem 1220 and a file storage subsystem 1225, user interface output devices 1230, user interface input devices 1235, a communications subsystem 1240, and the like.

In various embodiments, the computer system 1200 typically includes conventional computer components such as the one or more processors 1205. The file storage subsystem 1225 can include a variety of memory storage devices, such as a read only memory (ROM) 1245 and random access memory (RAM) 1250 in the memory subsystem 1220, and disk drives.

The user interface output devices 1230 can comprise a variety of devices including flat panel displays, touchscreens, indicator lights, audio devices, force feedback devices, and the like. The user interface input devices 1235 can comprise a variety of devices including a computer mouse, trackball, trackpad, joystick, wireless remote, drawing tablet, voice command system, eye tracking system, and the like. The user interface input devices 1235 typically allow a user to select objects, icons, text and the like that appear on the user interface output devices 1230 via a command such as a click of a button or the like.

Embodiments of the communication subsystem 1240 typically include an Ethernet card, a modem (telephone, satellite, cable, ISDN), (asynchronous) digital subscriber line (DSL) unit, FireWire (IEEE 1394) interface, USB interface, and the like. For example, the communications subsystem 1240 may be coupled to communications networks and other external systems 1255 (e.g., a network such as a LAN or the Internet), to a FireWire bus, or the like. In other embodiments, the communications subsystem 1240 may be physically integrated on the motherboard of the computer system 1200, may be a software program, such as soft DSL, or the like.

The RAM 1250 and the file storage subsystem 1225 are examples of tangible media configured to store data such as error-correcting code parameters, codewords, and program instructions to perform the operations described herein when executed by the one or more processors, including executable computer code, human readable code, or the like. Other types of tangible media include program product media such as floppy disks, removable hard disks, optical storage media such as CDs, DVDs, and bar code media, semiconductor memories such as flash memories, read-only-memories (ROMs), battery-backed volatile memories, networked storage devices, and the like. The file storage subsystem 1225 includes reader subsystems that can transfer data from the program product media to the storage subsystem 1215 for operation and execution by the processors 1205.

The computer system 1200 may also include software that enables communications over a network (e.g., the communications network 1255) such as the DNS, TCP/IP, UDP/IP, and HTTP/HTTPS protocols, and the like. In alternative embodiments, other communications software and transfer protocols may also be used, for example IPX, or the like.

It will be readily apparent to one of ordinary skill in the art that many other hardware and software configurations are suitable for use with the present invention. For example, the computer system 1200 may be a desktop, portable, rack-mounted, or tablet configuration. Additionally, the computer system 1200 may be a series of networked computers. Further, a variety of microprocessors are contemplated and are suitable for the one or more processors 1205, such as PENTIUM™ microprocessors from Intel Corporation of Santa Clara, Calif., USA; OPTERON™ or ATHLON XP™ microprocessors from Advanced Micro Devices, Inc. of Sunnyvale, Calif., USA; and the like. Further, a variety of operating systems are contemplated and are suitable, such as WINDOWS®, WINDOWS XP®, WINDOWS VISTA®, or the like from Microsoft Corporation of Redmond, Wash., USA, SOLARIS® from Sun Microsystems, Inc. of Santa Clara, Calif., USA, various Linux and UNIX distributions, and the like. In still other embodiments, the techniques described above may be implemented upon a chip or an auxiliary processing board (e.g., a programmable logic device or graphics processor unit).

The present invention can be implemented in the form of control logic in software or hardware or a combination of both. The control logic may be stored in an information storage medium as a plurality of instructions adapted to direct an information-processing device to perform a set of steps disclosed in embodiments of the present invention. Based on the disclosure and teachings provided herein, a person of ordinary skill in the art will appreciate other ways and/or methods to implement the present invention.

The rank modulation scheme described herein can be implemented in a variety of systems for encoding and decoding data for transmission and storage. That is, codewords are received from a source over an information channel according to a rank modulation scheme and are decoded into their corresponding data values and provided to a destination, such as a memory or a processor, and data values for storage or transmission are received from a source over an information channel and are encoded into a rank modulation scheme.

Figure 13:
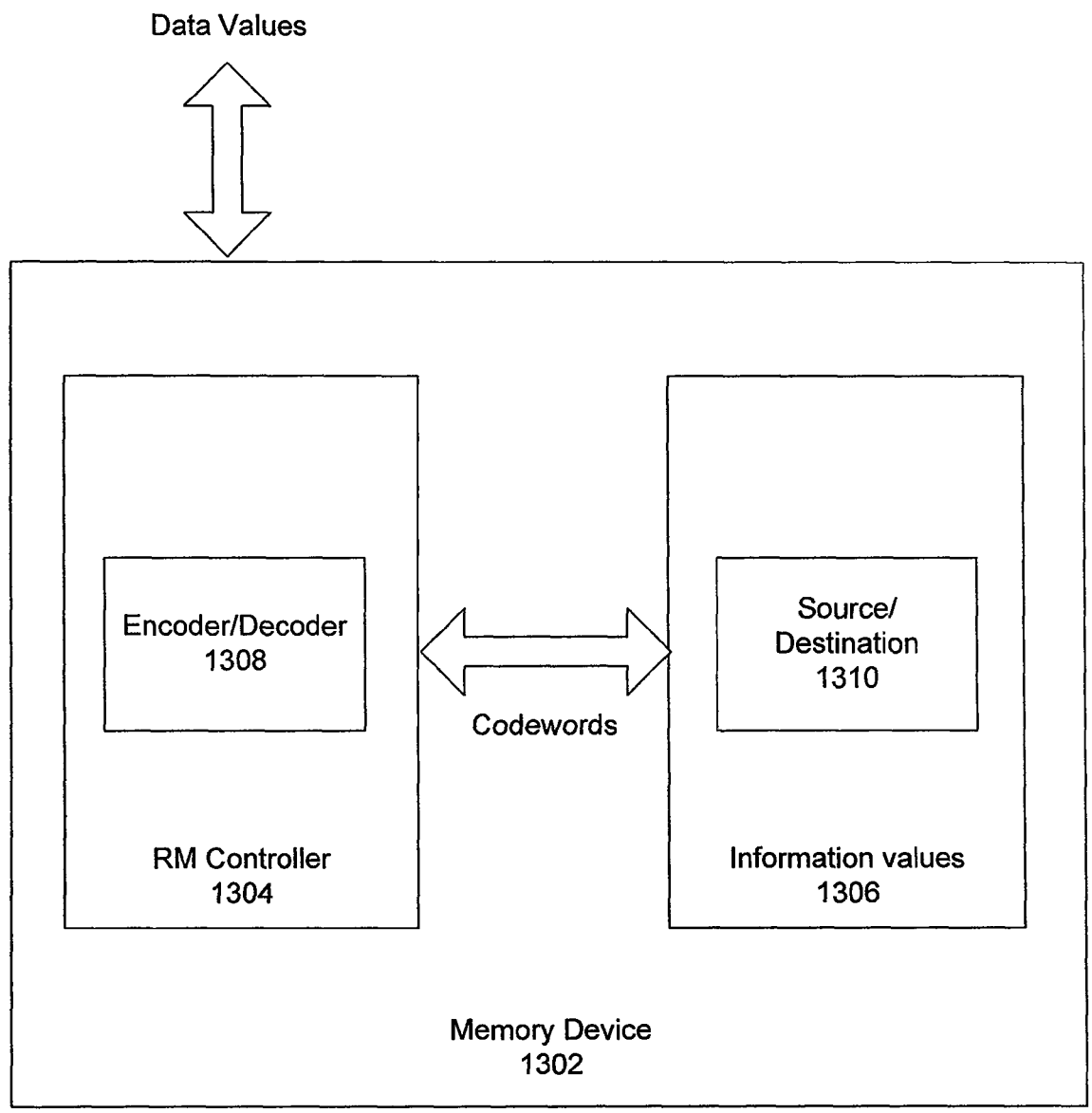
FIG. 13 is a block diagram that illustrates data flow in a system that operates according to the rank modulation scheme.

The operations of encoding and decoding data according to the rank modulation scheme can be illustrated as in FIG. 13, which shows data flow in a memory device 1302 that operates according to the rank modulation scheme described herein. In FIG. 13, the memory device includes a Rank Modulation (RM) controller 1304 that stores and retrieves information values 1306. The RM controller 1304 includes an encoder and decoder 1308 for encoding data values into codewords and decoding codewords into data values. The RM controller encodes data values and provides codewords to the source/destination block 1310, and decodes codewords from the source/destination and provides corresponding data values. The two-way nature of the data flow is indicated by the double-ended arrows labeled "data values" and "codewords". The RM controller includes interfaces through which the RM controller receives and provides the data values and the information values (codewords). The details of such interfaces will be known to those skilled in the art.

The information values 1306 comprise the means for physically representing the data values and codewords. For example, the information values 1306 may represent charge levels of memory cells, such that multiple cells are configured to operate as a virtual cell in which charge levels of the cells determine a permutation of the rank modulation code. Data values are received and encoded to permutations of a rank modulation code and charge levels of cells are adjusted accordingly, and rank modulation codewords are determined according to cell charge levels, from which a corresponding data value is determined. Alternatively, the information values 1306 may represent features of a transmitted signal, such as signal frequency, magnitude, or duration, such that the cells or bins are defined by the signal features and determine a permutation of the rank modulation code. For example, rank ordering of detected cell frequency changes over time can determine a permutation, wherein the highest signal frequency denotes the highest cell level. Other schemes for physical representation of the cells will occur to those skilled in the art, in view of the description herein.

For information values 1306 in the case of cell charge levels, the source/destination 1310 comprises memory cells in which n memory cells provide n cell values whose charge levels define a rank modulation permutation. For storing a codeword, the memory cells receive an encoded codeword and comprise a destination, and for reading a codeword, the memory cells provide a codeword for decoding and comprise a source. In the case of data transmission, the source/destination 1310 may comprise a transmitter/receiver that processes a signal with signal features such as frequency, magnitude, or duration that define cells or bins such that the signal features determine a permutation. That is, signal components comprising signal frequency, magnitude, or duration may be controlled and modulated by the transmitter such that a highest signal frequency component or greatest magnitude component or greatest time component corresponds to a highest cell level, followed by signal component values that correspond to other cell values and thereby define a permutation of the rank modulation code. When the source/destination 1310 receives a codeword from the controller 1304, the source/destination comprises a transmitter of the device 1302 for sending an encoded signal. When the source/destination provides a codeword to the controller 1304 from a received signal, the source/destination comprises a receiver of the device for receiving an encoded signal. Those skilled in the art will understand how to suitably modulate signal components of the transmitted signal to define rank modulation code permutations, in view of the description herein.

CONCLUSION

In this paper, we propose a novel data storage scheme useful for flash memories, a scheme called the rank-modulation scheme. It can eliminate cell over-programming and also be more robust to asymmetric errors. A rank-modulation scheme uses a new tool—the permutation of cell ranks—to represent data. Consequently, new error-correcting techniques suitable for permutations are needed. We study the properties associated with error-correcting rank-modulation codes, and show that the permutation adjacency graph, which describes the topology of permutations, is a subgraph of a multi-dimensional linear array. As a result, the error-correcting codes for rank modulation can be designed using Lee-metric codes and $L_1$-metric codes. We present a family of one-error-correcting codes whose size is within half of the optimal size, and also show the results of some other (more ad hoc) code constructions.

Other developments that may be possible with rank modulation will be to extend the code construction in this paper to design codes that correct two or more errors, by using new Lee-metric codes, $L_1$-metric codes, or suitable lattice interleavers. See, for example, Blaum, M. et al., *IEEE Transactions on Information Theory*, 44(2):730-743 (110108). The codes can also be improved by a better utilization of the sphere packing in the permutation adjacency graph, which is sparser than the array $L_n$. In addition, it will be interesting to combine the error-correcting codes with data rewriting schemes as described in Jiang, A. et al., *Proceedings of the 2007 IEEE International Symposium on Information Theory, ISIT2007*, Nice, France, pp. 1166-1170 (June 2007).

The embodiments discussed herein are illustrative of one or more examples of the present invention. As these embodiments of the present invention are described with reference to illustrations, various modifications or adaptations of the methods and/or specific structures described may become apparent to those skilled in the art. All such modifications, adaptations, or variations that rely upon the teachings of the present invention, and through which these teachings have advanced the art, are considered to be within the scope of the present invention. Hence, the present descriptions and drawings should not be considered in a limiting sense, as it is understood that the present invention is in no way limited to only the embodiments illustrated.

We claim:

1. A computer method of decoding a codeword, the method comprising:

receiving the codeword at a computer apparatus over an information channel from a source, wherein the codeword indicates n cell values that comprise a virtual cell in which relative rank ordering of the n cell values determines a permutation comprising one of n! permutations;

determining at the computer apparatus if the received codeword comprises a valid codeword of a rank modulation code wherein if the received codeword is determined to be a valid codeword, then computing a corresponding value for the codeword, and if the received codeword is determined not to be a valid codeword, then determining a corrected codeword that differs from the received codeword by a value r, where r is the number of errors in a codeword that the rank modulation code can correct, and computing a corresponding value for the corrected codeword.

2. A method as in claim 1, wherein the source comprises a memory in a data device and the information channel comprises a data connection of the data device.

3. A method as in claim 2, wherein the n cell values comprise charge levels of n memory cells of the data device.

4. A method as in claim 1, wherein the source comprises a transmitter that transmits a signal containing the codewords and the information channel comprises a communication channel over which the transmitter transmits the signal.

5. A method as in claim 4, wherein the n cell values comprise a feature of the signal, the feature selected from among signal features comprising signal frequency or signal magnitude or signal duration.

6. A method as in claim 1, wherein determining if the received codeword is valid comprises:

determining coordinates of the received codeword in an adjacency graph for the n! permutations, wherein for a received codeword permutation B given by B=[$b_1$, $b_2$, ..., $b_n$], for $2 \leq i \leq n$, the coordinates are determined according to a permutation $B_i$, where $B_i$ denotes a subsequence of permutation B that contains only those numbers in $\{1, 2, \ldots, i\}$ for a value of the i, and $p_i$ denotes the position of i in $B_i$, such that for every permutation B, the coordinates of a coordinate set $X_B$ are given by $X_B = (x_1, x_2, \ldots, x_{n-1}) = (2-p_2, 3-p_3, \ldots, n-p_n)$; and determining if the coordinates of the codeword are valid.

7. A method as in claim 6, wherein the coordinates are determined to be valid if and only if the coordinates satisfy a selected one of the following summation expressions:

$$\sum_{i=1}^{n-1} ix_i \equiv 0 (\mod\ 2n-1), \text{ or}$$

-continued $$\sum_{i=1}^{n-2} ix_i + (n-1)\cdot(-x_{n-1}) \equiv 0 (\bmod\ 2n-1),$$

such that the summation expression is selected in accordance with a predetermined one of the summation expressions that corresponds to the rank modulation code, so that the corresponding received codeword is valid if one of the summation expressions is true; and otherwise the received codeword is determined to be not valid.

8. A method as in claim 6, wherein determining if the coordinates are valid further comprises correcting a received codeword determined to be not valid, such that correcting comprises:
determining the set of valid coordinates that differ from the coordinates of the received codeword by distance r,
selecting one of the valid coordinates; and
computing a codeword that corresponds to the selected valid coordinate.

9. A method as in claim 8, wherein:
the distance r is given by r=1, such that the coordinates are determined to be valid if and only if the coordinates satisfy a selected one of the following summation expressions $$\sum_{i=1}^{n-1} ix_i \equiv 0 (\bmod\ 2n-1),\ \text{or}$$

$$\sum_{i=1}^{n-2} ix_i + (n-1)\cdot(-x_{n-1}) \equiv 0 (\bmod\ 2n-1),$$

such that the summation expression is selected in accordance with a predetermined one of the summation expressions that corresponds to the rank modulation code, so that the corresponding received codeword is valid if one of the summation expressions is true; and
computing a codeword comprises changing the value of the received codeword to be equal to a corrected codeword that corresponds to the valid coordinates.

10. A computer method of encoding a codeword, the method comprising:
receiving a data value to be encoded into a codeword at a computer apparatus, wherein the codeword indicates n cell values that comprise a virtual cell in which relative rank ordering of the n cell values determines a permutation comprising one of n! permutations;
generating at the computer apparatus a permutation A corresponding to the codeword, wherein A is given by A=[$a_1, a_2, \ldots, a_n$] integer values such that the [$a_1, a_2, \ldots, a_n$] permutation conforms to a rank modulation scheme for data representation, wherein the permutation A corresponds to a set of coordinates in an adjacency graph for the n! permutations, such that for A=[$a_1, a_2, \ldots, a_n$], for $2 \leq i \leq n$, the coordinates are determined according to a permutation $A_i$, where the $A_i$ denotes a subsequence of permutation A that contains only those numbers in $\{1, 2, \ldots, i\}$ for a value of the i, and $p_i$ denotes the position of i in $A_i$, such that for every permutation A, the coordinates of a coordinate set $X_A$ are given by $X_A=(x_1, x_2, \ldots, x_{n-1})=(2-p_2, 3-p_3, \ldots, n-p_n)$, and wherein the coordinates specify a value that can correct erroneously read coordinates that differs from the coordinates by a distance r; and
providing the permutation from the computer apparatus to a data destination over an information channel.

11. A method as in claim 10, wherein the distance r is given by r=1, such that the coordinates satisfy a selected one of the following summation expressions $$\sum_{i=1}^{n-1} ix_i \equiv 0 (\bmod\ 2n-1)\ \text{or}$$

$$\sum_{i=1}^{n-2} ix_i + (n-1)\cdot(-x_{n-1}) \equiv 0 (\bmod\ 2n-1).$$

12. A method as in claim 10, wherein the receiver comprises a memory in a data device and the information channel comprises a data connection of the data device.

13. A method as in claim 12, wherein the n cell values comprise charge levels of n memory cells of the data device.

14. A method as in claim 10, wherein the data destination comprises a transmitter that transmits a signal containing the codewords and the information channel comprises a communication channel over which the transmitter transmits the signal.

15. A method as in claim 14, wherein the n cell values comprise a feature of the signal, selected from among signal features comprising signal frequency or signal magnitude or signal duration.

16. A method as in claim 10, wherein generating a permutation A comprises performing a table lookup operation to identify a permutation stored in a permutation data table and generating the stored permutation as the permutation A.

17. A device that stores data, the device comprising:
a memory for storing the data;
a microcontroller that encodes the data such that n cells of the memory comprise a virtual cell in which relative rank ordering of the n cells determines a permutation comprising one of n! permutations, wherein the microcontroller determines a permutation A corresponding to the data for storing the permutation A in the n cells wherein A=[$a_1, a_2, \ldots, a_n$] such that the [$a_1, a_2, \ldots, a_n$] permutation conforms to a rank modulation scheme for data representation.

18. A device as in claim 17, wherein the microcontroller determines the permutation A in a table lookup operation to identify a permutation mapped to the data for storing in the device.

19. A device as in claim 17, wherein the permutation A corresponds to a set of coordinates in an adjacency graph for the n! permutations, such that for A=[$a_1, a_2, \ldots, a_n$], for $2 \leq i \leq n$ the coordinates are determined according to a permutation $A_i$, where the $A_i$ denotes a subsequence of permutation A that contains only those numbers in $\{1, 2, \ldots, i\}$ for a value of the i, and $p_i$ denotes the position of i in $A_i$, such that for every permutation A, the coordinates of a coordinate set $X_A$ are given by $X_A=(x_1, x_2, \ldots, x_{n-1})=(2-p_2, 3-p_3, \ldots, n-p_n)$.

20. A device as in claim 19, wherein the coordinates specify a value that can correct erroneously read coordinates that differs from the coordinates by a distance r.

21. A device as in claim 20, wherein the distance r is given by r=1, and such that the coordinates satisfy a selected one of the following summation expressions $$\sum_{i=1}^{n-1} ix_i \equiv 0 (\mod 2n-1) \text{ or}$$

$$\sum_{i=1}^{n-2} ix_i + (n-1) \cdot (-x_{n-1}) \equiv 0 (\mod 2n-1).$$

22. A device as in claim 17, wherein the microcontroller receives the data over an information channel comprising a data connection of the device.

23. A device as in claim 22, wherein the n cell values comprise charge levels of n memory cells of the device.

24. A device as in claim 17, wherein the device further includes a transmitter that transmits a signal containing codewords of the rank modulation scheme over an information channel that comprises a communication channel over which the transmitter transmits the signal.

25. A device as in claim 24, wherein the n cell values comprise a feature of the signal, the feature selected from among signal features comprising signal frequency or signal magnitude or signal duration.

26. A data device comprising:
an interface configured to receive and provide information values and data values;
a microcontroller configured to receive data values from the interface and determine corresponding rank modulation codewords and configured to receive information values comprising rank modulation codewords from the interface and determine corresponding data values, wherein the microcontroller performs operations to encode a data value into a rank modulation codeword such that the codeword is represented by a permutation of n cells that comprise a virtual cell in which relative rank ordering of a level associated with each of the n cells determines a permutation comprising one of n! permutations, wherein the microcontroller determines a permutation A corresponding to the data value for storing the permutation A in the n cells wherein $A=[a_1, a_2, \ldots, a_n]$ such that the $[a_1, a_2, \ldots, a_n]$ permutation conforms to a rank modulation scheme for data representation, and the microcontroller performs operations to decode a received rank modulation codeword into a permutation and determine a corresponding data value.

27. A device as in claim 26, wherein the microcontroller is configured to determine if a received codeword is valid by determining coordinates of the received codeword in an adjacency graph for the n! permutations, wherein for a received codeword permutation A given by $A=[a_1, a_2, \ldots, a_n]$, for $2 \leq i \leq n$, the coordinates are determined according to a permutation $A_i$, where $A_i$ denotes a subsequence of permutation A that contains only those numbers in $\{1, 2, \ldots, i\}$ for a value of the i, and $p_i$ denotes the position of i in $A_i$, such that for every permutation A, the coordinates of a coordinate set $X_A$ are given by $X_A=(x_1, x_2, \ldots, x_{n-1})=(2-p_2, 3-p_3, \ldots, n-p_n)$, and the microcontroller further determines whether the coordinates are valid.

28. A device as in claim 27, wherein the coordinates are determined to be valid if and only if the coordinates satisfy a selected one of the following summation expressions $$\sum_{i=1}^{n-1} ix_i \equiv 0 (\mod 2n-1) \text{ or}$$

$$\sum_{i=1}^{n-2} ix_i + (n-1) \cdot (-x_{n-1}) \equiv 0 (\mod 2n-1)$$

such that the summation expression is selected in accordance with a predetermined one of the summation expressions that corresponds to the rank modulation code, so that the corresponding received codeword is valid if one of the summation expressions is true, and otherwise the received codeword is determined to be not valid.

29. A device as in claim 27, wherein the microcontroller corrects a codeword determined to be not valid by performing operations comprising:
determining the set of valid coordinates that differ from the coordinates of the received codeword by distance r,
selecting one of the valid coordinates; and
computing a codeword that corresponds to the selected valid coordinate.

30. A device as in claim 29, wherein the distance r is given by r=1, such that the coordinates are determined to be valid if and only if the coordinates satisfy a selected one of the following summation expressions $$\sum_{i=1}^{n-1} ix_i \equiv 0 (\mod 2n-1) \text{ or}$$

$$\sum_{i=1}^{n-2} ix_i + (n-1) \cdot (-x_{n-1}) \equiv 0 (\mod 2n-1),$$

such that the summation expression is selected in accordance with a predetermined one of the summation expressions that corresponds to the rank modulation code, so that the corresponding received codeword is valid if one of the summation expressions is true; and wherein
the microcontroller changes the value of the received codeword to be equal to a corrected codeword that corresponds to the selected one of the valid coordinates.

31. A device as in claim 26, wherein the interface provides communication with a memory of the device configured to store the information values.

32. A device as in claim 31, wherein the n cell values comprise charge levels of n memory cells of the device.

33. A device as in claim 26, wherein the interface provides communication with a transmitter that transmits a signal containing the information values.

34. A device as in claim 33, wherein the n cell values comprise a feature of the signal, the feature selected from among signal features comprising signal frequency or signal magnitude or signal duration.

35. A computer method of generating a modulation code for use with a data storage device, the method comprising:
generating n! permutations, wherein the data storage device is configured to operate such that n cells of the storage device comprise a virtual cell in which relative rank ordering of the n cells determines a permutation of the n! permutations;
selecting one of the n! permutations as a starting permutation;
retaining only the generated permutations having a distance greater than or equal to (2r+1), wherein the retained generated permutations comprise a rank modulation codeword alphabet that define a modulation code capable of correcting r errors in a transmitted codeword.

36. A computer method as in claim 35, wherein retaining comprises:
- computing the distance for each pair of the generated permutations beginning with the selected permutation and each remaining permutation;
- retaining only the permutations having a distance greater than or equal to the (2r+1) distance; and
- repeating the computing and retaining for all the n! permutations.

37. A computer method as in claim 35, wherein generating comprises generating a coordinate set $X_B=(x_1, x_2, \ldots, x_{n-1})$ for a permutation B of the n cells, wherein the permutation B comprises the n! permutations given by $B=[b_1, b_2, \ldots, b_n]$, and the coordinates $X_B$ are defined as $X_B=(2-p_2, 3-p_3, \ldots, n-p_n)$ where for $2 \leq i \leq n$, the value $p_i$ is the position of i in the subsequence of B that contains only those numbers in $\{1, 2, \ldots, i\}$.

38. A computer method as in claim 37, wherein r is given by r=1 and B is determined to be a codeword in a first codeword alphabet $C_1$ if and only if:

$$\sum_{i=1}^{n-1} ix_i \equiv 0 (\bmod\ 2n-1),\ \text{and}$$

B is determined to be a codeword in a second codeword alphabet $C_2$ if and only if $$\sum_{i=1}^{n-2} ix_i + (n-1) \cdot (-x_{n-1}) \equiv 0 (\bmod\ 2n-1);\ \text{and}$$

wherein retaining comprises:
- selecting either the first alphabet $C_1$ or the second alphabet $C_2$ as the set of permutations B according to the alphabet containing the greater number of codewords.

39. A computer method as in claim 38, wherein generating the coordinate set $X_B$ is performed according to an initial permutation $A=[a_1, a_2, \ldots, a_n]=[1, 2, \ldots, n]$ and the permutation $B=[b_1, b_2, \ldots, b_n]$, wherein for $1 \leq i \leq n$, the permutation $A_i$ denotes a subsequence of the permutation A such that $A_i=[a_1, a_2, \ldots, a_i]$, $B_i$ denotes a subsequence of permutation B that contains only those numbers in $A_i$, and $p_i$ denotes the position of $a_i$ in $B_i$, then for every permutation $B=[b_1, b_2, \ldots, b_n]$, the coordinates of the first coordinate set $X_B=(2-p_2, 3-p_3, \ldots, n-p_n)$ for $2 \leq i \leq n$.

40. A computer method as in claim 35, further comprising:
- receiving n at a computer input interface, n comprising the number of cells with which the modulation code will be used;
- receiving r at a computer input interface, such that r comprises the number of errors in a transmitted codeword to be corrected by the modulation code; and
- performing the generating, selecting, and retaining in accordance with the received n and r.

41. A computer method for generating a modulation code for use with a data storage device, the method comprising:
- receiving n at a computer input interface, wherein the data storage device is configured to operate such that n cells of the storage device comprise a virtual cell in which relative rank ordering of the n cells determines a codeword value for a rank modulation code;
- receiving r at the computer input interface, such that r comprises the number of errors in a transmitted codeword to be corrected by the rank modulation code;
- generating a coordinate set $X_B=(x_1, x_2, \ldots, x_{n-1})$ for a permutation B of the n cells according to an initial permutation $A=[a_1, a_2, \ldots, a_n]=[1, 2, \ldots, n]$ and the permutation $B=[b_1, b_2, \ldots, b_n]$, wherein for $1 \leq i \leq n$, the permutation $A_i$ denotes a subsequence of the permutation A such that $A_i=[a_1, a_2, \ldots, a_i]$, $B_i$ denotes a subsequence of permutation B that contains only those numbers in $A_i$, and $p_i$ denotes the position of $a_i$ in $B_i$, then for every permutation $B=[b_1, b_2, \ldots, b_n]$, the coordinates of the first coordinate set $X_B$ are given by $X_B=(2-p_2, 3-p_3, \ldots, n-p_n)$ for $2 \leq i \leq n$; and
- determining that B is a codeword if the coordinates $X_B$ are valid.

42. A computer method as in claim 41, wherein the received r value is given by r=1 and B is determined to be a codeword in a first codeword alphabet $C_1$ if and only if:

$$\sum_{i=1}^{n-1} ix_i \equiv 0 (\bmod\ 2n-1)\ \text{and}$$

B is determined to be a codeword in a second codeword alphabet $C_2$ if and only if $$\sum_{i=1}^{n-2} ix_i + (n-1) \cdot (-x_{n-1}) \equiv 0 (\bmod\ 2n-1);$$

the method further including:
- repeating the generating and determining for the n values; and
- selecting either the first alphabet $C_1$ or the second alphabet $C_2$ as the set of permutations B according to the alphabet containing the greater number of codewords.

* * * * *